(12) United States Patent
Di Ronza et al.

(10) Patent No.: US 6,757,204 B2
(45) Date of Patent: Jun. 29, 2004

(54) CIRCUIT DEVICE HAVING A FUSE

(75) Inventors: Mario Di Ronza, Munich (DE); Olivier Picot, Munich (DE); Volker Schöber, Hanover (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/293,923

(22) Filed: Nov. 13, 2002

(65) Prior Publication Data

US 2003/0117829 A1 Jun. 26, 2003

(30) Foreign Application Priority Data

Nov. 13, 2001 (DE) .......................................... 101 55 620

(51) Int. Cl.[7] .................................................. G11C 7/00
(52) U.S. Cl. ..................................... 365/200; 365/225.7
(58) Field of Search ................................. 365/200, 225.7, 365/230.03

(56) References Cited

U.S. PATENT DOCUMENTS

| 6,205,063 B1 | 3/2001 | Aipperspach et al. ........ 365/200 |
| 6,353,570 B2 * | 3/2002 | Hwang et al. ............ 365/225.7 |
| 6,552,939 B1 * | 4/2003 | Miki et al. ................... 365/200 |

* cited by examiner

Primary Examiner—Vu A. Le
(74) Attorney, Agent, or Firm—Fish & Richardson, P.C.

(57) ABSTRACT

A semiconductor memory device includes a plurality of integrated circuit modules each having a plurality of module elements and at least one adjustable module element. At least one fuse box is electrically connected to the plurality of integrated circuit modules. The fuse box has a plurality of programmable fuse elements, that, when programmed, adjust the adjustable module element.

23 Claims, 14 Drawing Sheets

| FUSE CELL | FLIP FLOP | Description | Load input |
|---|---|---|---|
| 0 | 0 | Fuse to be left unblown | 0 |
| 0 | 1 | Fuse to blow | 1 |
| 1 | 0 | ERROR: fuse blown | 1 |
| 1 | 1 | Fuse already blown | 0 |

CIRCUIT DEVICE HAVING A FUSE

PRIORITY OF OTHER APPLICATIONS

This application claims priority from German Patent Application No. 101 55 620.9-53, filed Nov. 13, 2001, and entitled CIRCUIT DEVICE HAVING A CENTRAL FUSE.

TECHNICAL FIELD

The invention relates to a circuit device, and in particular, to a semiconductor memory device having a fuse.

BACKGROUND

Fuse boxes have widely been used to activate redundancies on chips or integrated circuits, mostly for memory design. Specifically, redundancies have been used in DRAM design since the 256 k generation to improve yield and profitability. In redundancy, spare elements such as rows and columns are used as logical substitutes for defective elements. The substitution is commonly controlled by a physical encoding scheme. As memory density and size increase, redundancy continues to gain importance. Modern DRAM designs typically employ both row and column redundancy concept. Thus, memory fault repair is a reconfiguration of the memory circuit that inhibits the use of faulty circuit elements and enables the use of operating spare (redundant) elements. Circuit elements, which are repaired in a memory, include rows, columns, blocks (clusters), subarrays and arrays of memory cells.

The repair procedure typically consists of three phases: (1) detection and location of faulty (defect) elements, (2) assignment of operating spare (redundant) elements, and (3) disconnection of the faulty elements and integration of the assigned redundant elements with the memory operation.

Disconnection of faulty elements and engagement of spare elements may be implemented externally by laser, fuse and antifuse programming or by on-chip repair circuit applying electrical fuse, antifuse, EPROM, EEPROM, FRAM, SRAM or other by stable programmable circuit elements which, in the following, are simply referred to as fuse elements. These fuse elements are provided in a fuse box (or fuse repository) which is able to activate the redundant circuit elements provided as spare elements in the circuit to be repaired.

Besides the application of fuse boxes in defect repairable circuit designs, it is also possible to use fuse boxes in electrical circuit modules which contain adjustable circuit elements which can be adjusted by an appropriate programming of the fuse elements contained in the fuse box. For example, fuse boxes could also be employed in analogue circuits for trimming purposes; wherein adjustable circuit elements are adjusted such that the circuit meets predetermined circuit specifications.

In commonly known modern circuit devices, such as semiconductor memories, each individual semiconductor circuit is provided with a local fuse box connected thereto. This fuse box serves the associated circuit in that it enables the activation of adjustable circuit elements therein. If a semiconductor memory chip, for example, contains six memory circuits thereon, then at least six separate local fuse boxes connected to these memory circuits are commonly provided.

Integrated logic and, particularly, memory circuits are constantly miniaturized in order to constantly increase the memory density per unit chip area. Employing fuse box layout concepts, however, requires additional chip area since the commonly used laser programmable fuse elements have minimum sizes defined by the laser programming process. Consequently, there exists a trade-off between memory density and yield improvement when using fuse box concepts.

In view of these drawbacks encountered in the prior art, the problem to be solved by the invention is to provide a circuit device, in particular a semiconductor memory device, which employs a fuse box concept having programmable fuse elements adapted to adjust adjustable elements, which consumes less chip area.

SUMMARY

According to one aspect of the invention, a semiconductor memory device includes a plurality of integrated circuit modules each having a plurality of module elements and at least one adjustable module element. At least one fuse box is electrically connected to the plurality of integrated circuit modules. The fuse box has a plurality of programmable fuse elements, that, when programmed, adjust the adjustable module element.

Thus, the at least one fuse box or fuse repository (which can contain several fuse boxes and which can be partitioned in the layout to have several fuse box blocks) is associated with a plurality of integrated circuit modules. The integrated circuit modules have to be understood as independent integrated circuits, i.e., autonomous integrated circuits, such as different memory circuits on a semiconductor memory chip. Therefore, the term integrated circuit modules refers to independent integrated circuits on a chip and not to parts of a single integrated circuit on this chip.

According to another aspect of the invention, several of the independent integrated circuit modules are connected to a single fuse box or fuse repository, which constitutes a central fuse box of the circuit device. This central fuse box serves different integrated circuit modules by enabling an adjustability of the integrated circuit modules by adjusting the adjustable module elements thereof. This is achieved by a suitable programming of the fuse elements of the fuse box.

Preferably, all components of the at least one fuse box are clustered or grouped in one designated region within the circuit device, e.g., a designated region of the chip. In particular, the programmable (or adjustable) fuse elements of the fuse box are concentrated in a designated fuse element area. In case that laser-programmable fuse elements are used within the fuse box, such clustering or grouping of the programmable fuse elements greatly facilitates the positioning and programming of the laser-programmable fuse elements by the laser programming tool.

In the prior art, local fuse boxes have been widely employed in circuit devices. These local fuse boxes only serve adjacent or close by integrated circuits and are not adapted to configure adjustable module elements, for example, the whole chip. In contrast to the prior art, the control logic provided within the fuse box according to the invention does not linearly increase in its complexity when the number of programmable fuse elements is increased. The inventive (centralized) fuse box requires less chip area compared to several local fuse boxes. This will lead to a considerable reduction of production costs.

According to a preferred embodiment, the number of the programmable fuse elements is not sufficient to adjust all of the adjustable module elements of all of the integrated circuit modules. Thus, the invention proposes to intentionally select the number of programmable fuse elements such that it does not allow to configure all of the adjustable module elements of all of the integrated circuit modules simultaneously. Instead, the number of the programmable fuse elements is only sufficient to adjust a fraction of the adjustable module elements. For example, the number of the programmable fuse elements could be selected such that only up to 90%, preferably only up to 75% and even more preferably only up to 50% of the adjustable module elements of all the integrated circuit modules could be adjusted therewith.

Surprisingly, this substantial reduction of the number of the programmable fuse elements does not greatly affect the overall yield in the production of circuit devices according to the invention. This is essentially due to the fact that in many applications only adjustable module elements in a specific region of the circuit device need to be adjusted. If, for example, the adjustable module element is a redundant module element adapted to replace a defect module element, then only the redundant module elements in certain areas of the circuit device need to be activated. In this context, it has to be borne in mind that defects (defect module elements) in circuit devices are very often clustered leading to fault-free circuit device areas and faulty circuit device areas.

Since one aspect of the invention provides a circuit device with a centralized fuse box, it is very often possible to activate all necessary redundant module elements in order to replace defect module elements in circuit device areas, where defect clustering occurs. Therefore, even though the number of the programmable fuse elements is considerably reduced compared to conventional circuit devices with fuse boxes, it is in many cases nevertheless possible to configure all necessary adjustable module elements even with this reduced number of programmable fuse elements. Only in cases, when a "worst case scenario" is encountered, i.e., in cases where all of the adjustable module elements of all of the integrated circuit modules need to be adjusted, this number of the programmable fuse elements is not sufficient. This drawback, however, only rarely occurs and is more than compensated by the great benefit of a considerably reduced chip area consumption of the fuse box.

According to another preferred embodiment, the integrated circuit modules are defect repairable circuit modules and the adjustable module element is a redundant module element adapted to replace a defect module element. As stated previously, a major application of fuse box concepts resides in the configuration of defect repairable circuits. In this case, the fuse elements of the fuse box can be used to configure or adjust a redundant module element in such a way, that it electrically replaces a defect module element. Thus, for example production faults occurring within the production of the circuit device can be repaired to a certain degree.

The defect repairable circuit modules could be defect repairable memories and the redundant module element could be a redundant memory element. The described inventive concept of using a centralized fuse box is particularly suited for defect repairable memory concepts for example in DRAM designs.

According to a preferred embodiment, the fuse elements comprise volatile and/or non-volatile memories, particularly laser-programmable fuse elements and/or electrically programmable fuse elements. Typically, the programmable fuse elements used in fuse boxes are laser-programmable fuse elements which can be programmed by cutting a fuse link by a focused laser beam. However, also electrically-blowable fuse elements have been widely used. The invention is also applicable to all other kinds of fuse elements as long as they are bistable elements. For example, the fuse elements could also be some sort of volatile and/or other non-volatile memories. Also, the fuse box comprising the programmable fuse elements could be connected to another fuse box of a higher hierarchy, which is adapted to control the state of the fuse box in the lower hierarchy circuit device. A hierarchical fuse box concept could be obtained in this way.

According to another embodiment, the fuse box is formed on a separate fuse chip or a separate fuse board or MCM. For example, a special fuse chip could be designed and optimized which only contains fuse boxes. The production process for the designated fuse chip would in this case not suffer from any constraints which might arise if this production process also has to be applied to a semiconductor memory chip.

According to another preferred embodiment, the fuse box comprises at least one fuse box register connected to the fuse elements for storing fuse data. The fuse box register can be designed as a shadow register, the register element of which are connected in parallel to associated fuse elements. Thus, preferably each register element is exactly connected in a 1:1 mapping to exactly one fuse element. Furthermore, the fuse box register preferably comprises a register input and a register output for serially shifting fuse data in and out of the fuse box register.

According to another preferred embodiment the fuse box controller of the fuse box is adapted to detect upload and/or download errors of data uploaded/downloaded into/from the fuse box. For example, fuse data could initially be stored in a plurality of fuse elements. In an initializing step, the fuse elements are read out and its contents are stored in fuse box register elements of a fuse box register. From the fuse box register the data could be downloaded to integrated circuit modules containing adjustable module elements. If a data transmission error occurs during the download from the fuse box to the integrated circuit modules, the fuse box controller could set an error flag. Similarly, if an error occurs upon uploading of data from the integrated circuit modules to the fuse box, transmission faults could also be indicated.

According to another preferred embodiment the fuse box comprises a bi-directional input/output pin for inputting and/or outputting fuse data. This bi-directional input/output pin allows a serial transferal of data to and from the fuse box. For example, fuse data could be outputted to some external testing tool in order to analyze faults of a defect repairable memory.

According to a particularly preferred embodiment of the invention, the at least one fuse box and the integrated circuit modules are serially connected in a daisy chain arrangement. Compared to a parallel connection scheme of the circuit modules and the fuse box in for example a tree- or star-like architecture, the serial daisy chain arrangement requires less wires to be routed across the chip. Thus, the daisy chain arrangement implies that at least one wire serially passes through the integrated circuit modules and the fuse box so that not every integrated circuit module is directly connected to the fuse box by a (parallel) wire.

According to another preferred embodiment of the invention, the fuse box comprises a fuse box controller enabling serial shift operations of data through the daisy chain arrangement. Preferably, the data stored in the fuse elements of the fuse box is first read out into a fuse box register. Subsequently, the data is serially shifted out from the fuse box register to the integrated circuit modules in order to adjust the adjustable module elements.

Preferably, the fuse box has a fuse data input and a fuse data output connected to opposite ends of the chain of serially connected integrated circuit modules, respectively. Accordingly, the daisy chain of serially connected integrated circuit modules is connected to input/output terminals of the fuse box at opposite ends to form a closed loop. Preferably, data can be serially shifted from the fuse box to the integrated circuit modules (download operation) or serially shifted from the integrated circuit modules back to the (central) fuse box (upload operation). Preferably, a fuse box controller of the fuse box enables uploading of data from the integrated circuit modules to the fuse box. The uploading operation can thus be easily controlled by the fuse box controller of the fuse box.

Preferably, the fuse box controller is adapted to program at least one of the fuse elements based on an analysis of the uploaded data in order to adjust and/or readjust at least one of the integrated circuit modules. Thus, in this particularly preferred embodiment, several fuse sessions/fuse passes are possible. For example, during a first and initial fuse pass, fuse data is downloaded from the fuse box (e.g., from the fuse box register) to the integrated circuit modules. This first download operation of fuse data to the integrated circuit modules could for example activate a first set of adjustable module elements in a desired manner. If, in a later testing or operational stage of the circuit device, a further necessity of adjusting or readjusting some or all of the integrated circuit modules arises, then a second fuse pass (second fuse session) might be performed. In this case, the data of the adjustable module elements, for example of redundancy registers of defect repairable memories, are uploaded into the fuse box (e.g., into a fuse box register in the fuse box). The fuse box controller is preferably adapted to determine the differences between the original fuse data and new data e.g., from a subsequently performed test run in order to program new fuse elements in the next fuse session. Furthermore, the fuse box is preferably adapted to identify additionally programmed registers in the integrated circuit modules by other tools. After identifying (by comparing fuse content and integrated circuit module content) the appropriate signals/data are uploaded into the fuse box to start a further (second, third, . . . ) burn session.

According to a preferred embodiment, the fuse box and the integrated circuit modules are connected by one bi-directional data line and at least two control lines. Preferably, the control lines control the handover mechanism of the data upload/download from/to the integrated circuit modules to the (centralized) fuse box. As a bi-directional data line is used for transmitting data between the integrated circuit modules and the central fuse box, fewer wires then in comparable parallel wiring concepts are necessary which implies that less chip area is consumed by wiring.

According to another preferred embodiment, the fuse box contains a plurality of data fuse elements and a plurality of control fuse elements, the control fuse elements being adapted to control at least one multiplexer of at least one of the integrated circuit modules in order to configure the daisy chain arrangement. Thus, a first level of fuse elements is provided in the fuse box for storing fuse data needed for adjusting the adjustable module elements of the integrated circuit modules. Additionally, a second level of fuses referred to as control fuse elements is provided in order to configure the at least one multiplexer. By programming the control fuse elements, it is possible to control the multiplexer such that one or more of the integrated circuit modules are for example bypassed by the daisy chain.

Preferably, at least one of the circuit modules comprises two multiplexers connected by a bypass line and, in a bypass stage of the multiplexers, the bypass line forms part of the daisy chain so that at least a part of the adjustable circuit module is bypassed by the daisy chain. Preferably, the multiplexers are disposed at the input and output of the integrated circuit module, respectively. In a bypass state of the multiplexers, incoming data is routed by the input multiplexer into the bypass line and through the output multiplexer out of the integrated circuit module. Consequently, at least a part of the integrated circuit module is bypassed and is no longer part of the daisy chain arrangement. Accordingly, the controllable multiplexers allow a specific "addressing" of integrated circuit modules by fuse data sent from the fuse box.

According to another preferred embodiment, the fuse box controller is adapted to form a formatted bit stream of fuse data to be inputted into and/or outputted from the fuse elements, the bit stream comprising for each adjustable circuit module at least one adjustment control bit and, if the adjustment control bit is set, a plurality of data bits. It has to be understood that inputting/outputting of fuse data into or out from the fuse elements could also imply inputting/outputting of data into register elements of a fuse box register. Preferably, the fuse box controller is adapted to compress/decompress data outputted to the integrated circuit modules and/or compress data inputted from the integrated circuit modules into the fuse box. Preferably, the formatted bit stream can directly be used for a programming operation of the fuse elements without any further (external) signal processing of the fuse data.

Preferably, the data bits represent address value data bits of a defect circuit element to be replaced by the redundant circuit element associated with the adjustment control bit. Consequently, in case the adjustment control bit is set, the following data will be considered as address value bits of a defect circuit element. Conversely, if the adjustment control bit is not set, dummy data bits could be generated and outputted by the fuse box controller to the integrated circuit modules. Therefore, in case an adjustable module element does not need to be adjusted by programming of associated fuse elements, it is not necessary to designate fuse elements for data bits representing address value data bits for this adjustable module element. Instead, preferably only a single adjustment control bit is deactivated (for example set to logic 0) in order to indicate that the adjustable module element does not need to be adjusted. In this case, no further fuse elements need to he associated with this adjustable module element. This effectively results in a data compression/decompression of data inputted/outputted to/from the fuse elements. This in turn results in an increased number of adjustable module elements which can be adjusted by a given number of fuse elements. Conversely, for a given number of adjustable module elements which should be simultaneously adjustable, less fuse elements need to be provided within the centralized fuse box.

Preferably, the fuse data comprise at least one length controlled bit indicating the number of following data bits. In case the centralized fuse box is used in a complex system of different integrated circuit modules having different address lengths, a formatted bit stream having a length control bit could be used wherein the length control bit indicates the number of following data bits (for example address length bits). Therefore, it is not necessary to associate all integrated circuit modules with the maximum number of fuse elements needed by a single integrated circuit module. Instead, the number of fuse elements associated with individual integrated circuits modules can be controlled independently.

In the following, the invention will be described by way of examples with reference to preferred embodiments shown in accompanying drawings. These preferred embodiments all refer to defect repairable memories having redundant memory elements which can be activated by programming associated fuses. However, it has to be understood that the invention is not restricted to such applications.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
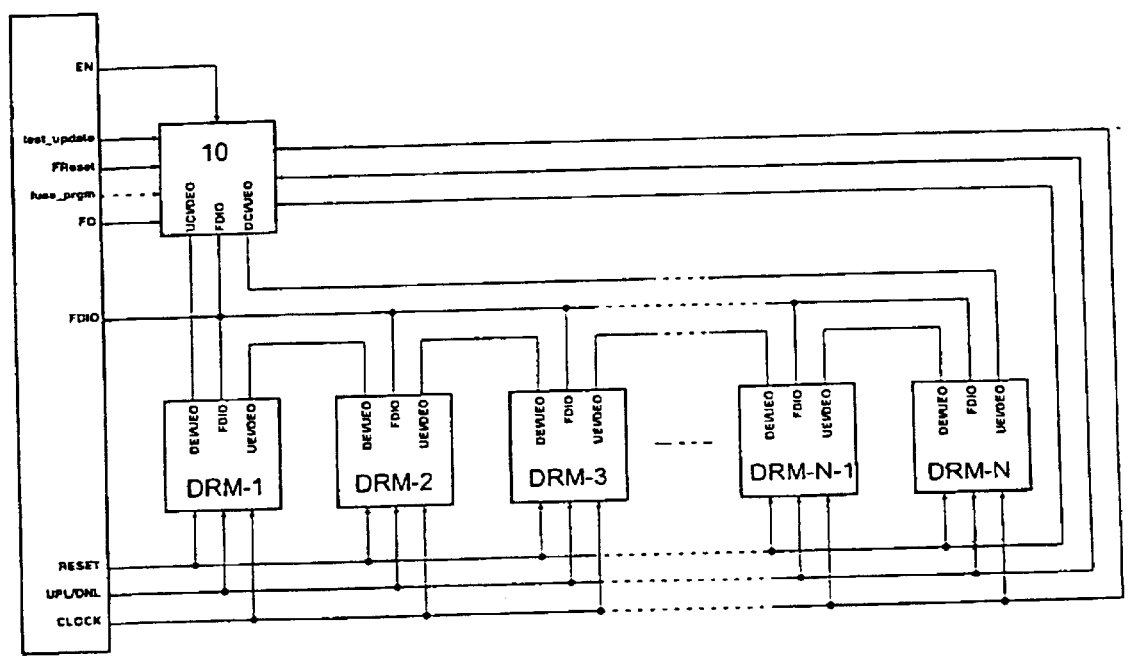
FIG. 1 is a schematic block diagram of a circuit device according to a first embodiment of the invention.

Fuse boxes can for example be used to activate on-chip redundancies, mostly for designs including large memory arrays. Additionally, fuse box concepts are also applicable in logic circuits or even analogue circuits for trimming purposes. The importance of fuse boxes will rise with the growing size of designs and, in particular, the probability that defects occur in the chip.

Conventionally, the number of fuse elements in the (local) fuse boxes associated with defect repairable memories is calculated for the worst case scenario when it is not known which fuses will have to be activated. Typically however, only a certain percentage of the available fuse boxes or fuses need to be activated in a tested chip, while the remaining are left unused. Thus, in conventional circuit devices employing local fuse box concepts, a considerable part of the fuse boxes/fuse elements is regularly not used so that a lot of valuable chip area is wasted.

The invention proposes to use centralized fuse box concepts, wherein at least one fuse box serves a plurality of integrated circuit modules (for example defect repairable memory modules). Moreover, a typical characteristic of circuit defect distributions can be considered: Typically, defects or failures are often clustered leading to defect repairable memories with failures and other memories without failures. Consequently, only in very rare and extreme cases of device failures, all possible redundancies (i.e., all adjustable module elements such as redundant memory elements) have to activated simultaneously in order to repair the chip. Instead, usually only a fraction (for example 50%) of the redundant memory elements need to be activated for a complete repair.

Therefore, without any noticeable effect on defect repair flexibility, it is possible to reduce the number of fuse elements provided in the central fuse box compared to the number of fuses in circuit devices employing conventional fuse box concepts. The exact number of fuse elements provided in the fuse box is preferably selected in accordance with defect statistics.

The advantage will be that the number of fuse boxes and number of necessary fuse elements can be reduced on the whole chip. In addition, multiple fuse passes (i.e., multiple fuse sessions) are possible which in turn allows fusing in a very late state of the device production. This is of particular advantage if electrical or other on-chip programmable fuse elements are used. In this case, fusing additional failures in the design will be possible also in different steps after additional errors are detected. Advantageously, also defect fuse boxes/fuse elements can be repaired. If, for example, a first fuse session has not achieved the desired results, because e.g., one (defect) fuse element could not be properly programmed, it is possible to correct or repair the circuit device by performing a second fuse session. Specifically, in the second fuse session, registers having already been programmed in the first session can be overwritten.

In the following, a first preferred embodiment of a circuit device according to the invention and modifications thereof will be described with reference to FIGS. 1 to 14.

The circuit device according to the first embodiment of the invention comprises a (central) fuse repository or fuse box 10. The fuse repository or fuse box 10 is connected with a plurality of integrated circuit modules DRM-1, DRM-2, ..., DRM-N via a daisy chain structure. In this embodiment, the integrated circuit modules are defect repairable memories (DRM). Each defect repairable memory comprises a least one adjustable module element (a redundant memory element), which can be adjusted by programming fuse elements of the fuse box 10 to replace a defect memory element.

In the daisy chain structure, all laser-cut/electrical fuses needed by on-chip defect repairable memories are placed in this common fuse repository 10, to which all memories are connected in a daisy-chain arrangement. All blocks in the daisy chain share a common bi-directional data line (FDIO) which can be used for interfacing an external testing equipment; additional control lines (DEI/UEO and UEI/DEO) are provided to control the prioritized access to FDIO.

The main advantage of such a connection scheme is that only a few bi-directional signal lines are routed across the chip to link the fuse box 10 and the defect repairable memories DRM-1, ..., DRM-N together, instead of using large buses to read/write the fuse values in parallel.

After testing all defect repairable memories DRM-1, ..., DRM-N, the detected faulty addresses are streamed out from the redundant address registers to the central fusebox 10 (upload) for a pre-fuse test or for blowing electrically programmable fuse elements, if available. Faulty address data can be also streamed out to an external testing equipment through the FDIO pin and used for detection of failing memory blocks or for blowing laser-cut fuse elements of the fuse box 10.

Values stored in the central fuse repository 10 are distributed serially to all memories DRM-1, ..., DRM-N at system startup to properly initialize their redundant address registers (download). Cascading memories infers a prioritization scheme for which, during download, defect repairable memory #1 takes the highest priority (i.e., is downloaded first) followed by DRM-2, DRM-3 up to DRM-N. The order is inverted during upload, i.e., DRM-N is read first followed by memory DRM-(N−1) down to DRM-1. The data direction is controlled by the UPL/DNL signal. Enabling data transfers between the fuse box and the DRMs is controlled by the EN input.

The bit stream is logically split into variable length portions of faulty address values which are transferred in sequence from all memories to the central fuses repository 10 and vice-versa. This is achieved by means of a simple handover mechanism controlled by control signals, so called marker bits(EM/FA) inserted in the bit stream.

The marker bits allow variable length data to be exchanged between each DRM and the common fuses box 10, depending on the number of faulty addresses the memory needs to upload/download. Valid EM bits are always set at 0, while valid FA bits are always set at 1. Signal UPL/DNL set to high (upload) selects the direction of the FDIO line from the DRMs towards the fuses repository 10 and disables signals DEI, DCI and DEO.

The upload starts when the fuse box, specifically the fuse box controller, activates its Upload Enable Output UEO, which is connected to the Upload Enable Input UEI of DRM-N.

Signal UEO from DRM-N is held inactive to prevent other memories from driving the FDIO line. Data are output from DRM-N as long as at least one active Fuse Activation bit (FA) is stored in its redundant address registers. Once all its faulty addresses are flushed out, DRM-N activates its UEO output which is connected to the UEI input of the next memory in the chain.

This memory is now entitled of driving the FDIO line; the sequence continues until the signal UEI of DRM-N is propagated to the signal UEO of DRM-1 which is fed back to the UCI input of the fuse repository 10 to form an upload verification loop.

The counter inside the fuses repository is incremented during upload. At the end of the process, the counter contains the total number of uploaded bits (including markers). The Fail Output signal FO not going high for at least one clock cycle before the counter overflows indicates that an error occurred during the upload phase.

Signal UPL/DNL set to low (download) selects the direction of the FDIO line from the fuses repository 10 towards the DRMs and disables signals UEI, UCI and UEO. The download starts when the fuse box 10 activates its Download Enable Output DEO, which is connected to the Download Enable Input DEI of DRM-1. The Signal DEO from DRM-1 is held inactive to prevent other DRMs from downloading the same bit stream portion. Data are downloaded into DRM-1 from the Faulty-address Data Input/Output (FDIO) until an End-of-stream Marker (EM) is encountered. Once an EM marker is detected, DRM-1 activates its DEO output which is connected to the DEI input of the next memory in the chain. This DRM is now entitled of downloading the portion of the bit stream preceding the next EM marker; the sequence continues until the signal DEI of DRM-1 is propagated to the signal DEO of DRM-N which is fed back to the DCI input of the fuses repository 10 to form a download verification loop.

The counter inside the fuses repository 10 is decremented during download; at the end of the process the counter reaches zero. Signal FO going high for at least one clock cycle indicates that an error occurred during the download phase.

Figure 2:
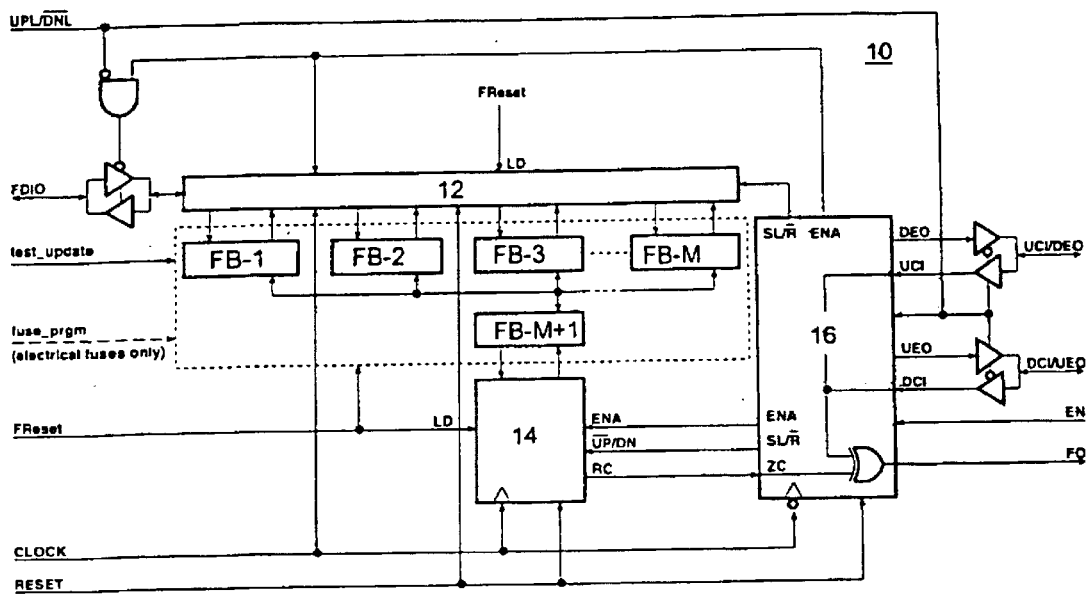
FIG. 2 is a schematic block diagram of a central fuse box of the circuit device shown in FIG. 1.

A fuse repository block diagram of the circuit device shown in FIG. 1 is shown in FIG. 2. All fuseboxes FB-1, ..., FB-M are grouped inside this block and connected to a parallel-load bi-directional shift register 12 used for serial/parallel conversion. Dedicated extra fuse elements (or fuseboxes) FB M+1 are provided to preset an internal counter 14 to the total number of fuse values to download into the DRMs. A fuse box controller 16 containing control logic is provided to control and synchronize the blocks inside the repository 10. The control logic is triggered by the EN input. All the fuse elements FB-1, ..., FB-M+1 (or fuseboxes provided inside the central fusebox 10) share the FReset and test_update control inputs to preset the internal counter 14 and to move data between the shift register and the fuse box latches to allow downloading/pre-fuse test. If electrically programmable fuse elements are used, an additional fuse_prgm is provided to program the fuse elements in all M+1 fuse boxes/fuse elements.

Figure 3:
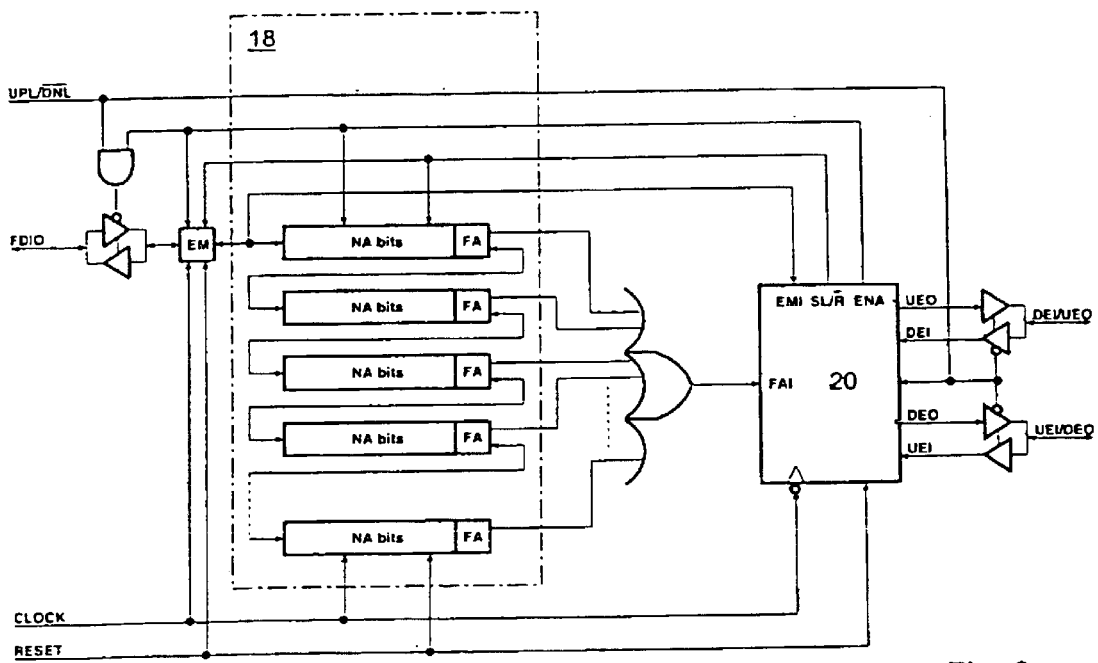
FIG. 3 is a schematic block diagram of a redundant address register array for each defect repairable memory of the circuit device of FIG. 1.

A redundant address register block diagram is shown in FIG. 3. All registers are cascaded to form a parallel-load bi-directional shift register 18. Each redundant address register consists of NA+1 bits; NA is the number of address bits and is memory-specific, i.e., different memories in the chain may have different NA values. All Most-Significant Bits (FA bits, which are used as FA markers) are OR-ed to generate the FAI (Fuse Activation Input) signal which indicates that at least a faulty address is stored in the registers.

An additional flip-flop is provided to store the value of the latest EM in the incoming bit stream; this flip-flop contains a zero value before an upload or after a download.

Signals FAI and EMI are checked by the control logic 20 after every NA clock cycles to determine whether to continue/end the ongoing upload/download process. The fuse repository 10 and all memory interfaces are synchronous with a common CLOCK signal.

Figure 4:
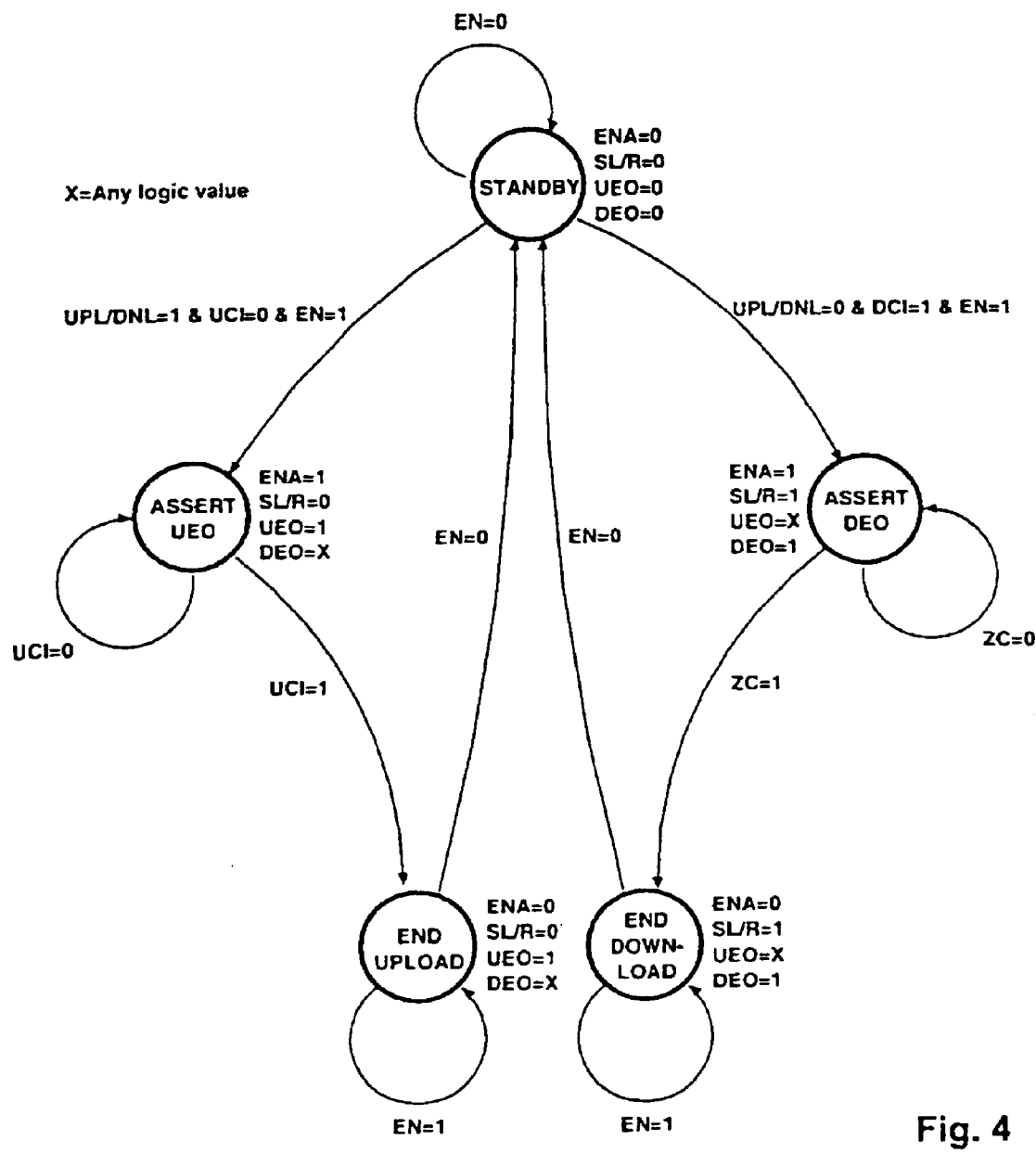
FIG. 4 is a fuse box control logic state diagram of the circuit device of FIG. 1.

The state diagram of the fuse box control logic is shown in FIG. 4. The depicted states are the following:

STANDBY: standby state; this state is entered when the RESET input is activated or when the EN input is deactivated.

ASSERT UEO: data upload state; this state is entered when an upload is started and held until the UCI input becomes active.

END UPLOAD: end upload state; standby state after an upload sequence has come to completion.

ASSERT DEO: data download state; this state is entered when a download is started and held until the ZC (Zero Count) signal becomes active.

END DOWNLOAD: end download state; standby state after a download sequence has come to completion.

Figure 5:
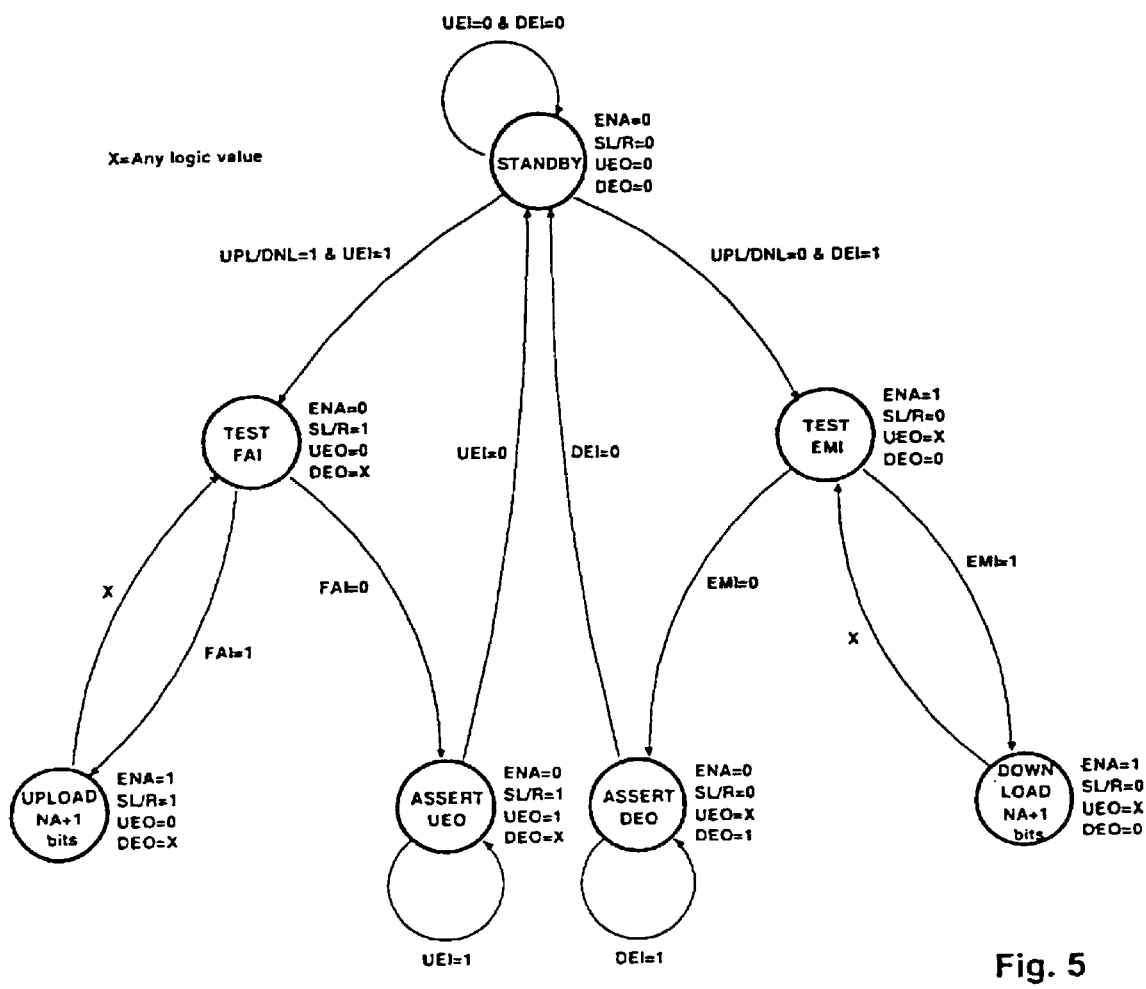
FIG. 5 is a redundant address register control logic state diagram of the circuit device of FIG. 1.

The state diagram of the redundant address register control logic is shown in FIG. 5. The depicted states are the following:

STANDBY: standby state; this state is entered when the RESET input is activated and held as long as both signals UEI and DEI are inactive.

TEST FAI: test the FAI input value state; this state is entered during upload.

ASSERT UEO: end of data upload state; this state is entered when an upload is terminated(FAI=0) and held until the UEI input remains active.

UPLOAD NA+1 bits: count NA+1 uploaded bits state; in this state a counter is enabled to keep count of bits uploaded from one redundant address register (including the FA marker), the LSB (Least Significant Bit) being output first. The UPLOAD NA+1 state is held for NA+1 CLOCK cycles.

TEST EMI: test the EMI input value state; this state is entered during download.

ASSERT DEO: end of data download state; this state is entered when an download is terminated (EMI=0) and held until the DEI input remains active.

DOWNLOAD NA+1 bits: count NA+1 downloaded bits state; in this state a counter is enabled to keep count of bits downloaded to one redundant address register (including the FA marker), the MSB (Most Significant Bit) being input first. The DOWNLOAD NA+1 state is held for NA+1 CLOCK cycles.

Figure 6:
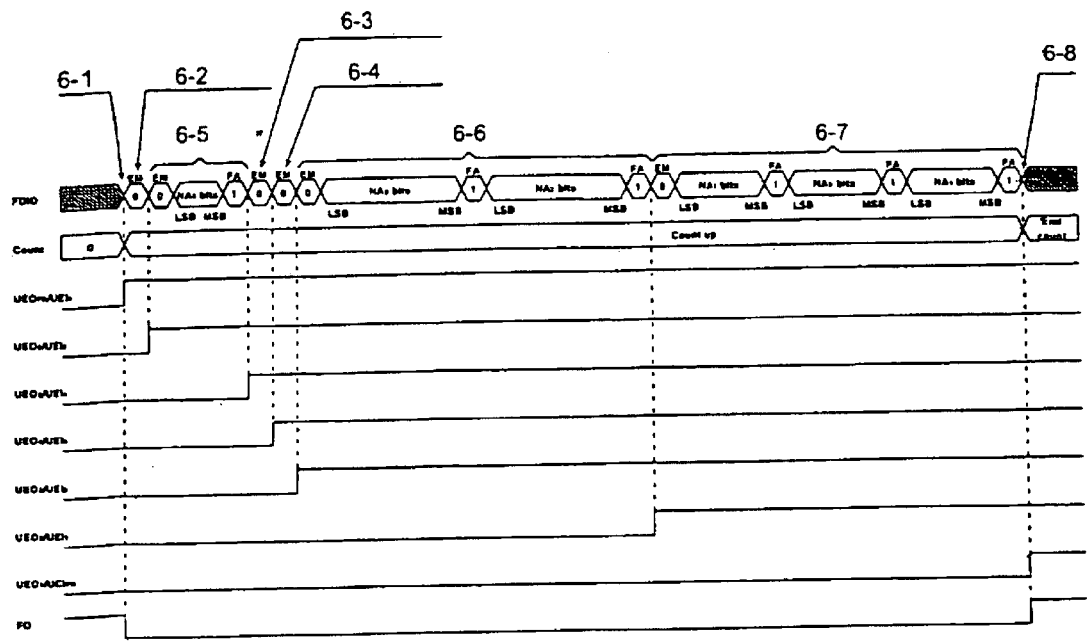
FIG. 6 is a timing diagram showing the readout of faulty address values from defect repairable memories (upload to the central fuse box) of a circuit device shown in FIG. 1.

FIG. 6 shows a timing diagram of a faulty address values upload completed successfully. In this Figure, the following abbreviations are used:

6-1: Start upload
6-2: No faulty address vector from DRM #6
6-3: No faulty address vector from DRM #4
6-4: No faulty address vector from DRM #3
6-5: 1 faulty address vector from DRM#5
6—6: 2 faulty address vectors from DRM#2
6-7: 1 faulty address vector from DRM#1
6-8: End upload The counter inside the fuses repository 10 is reset before uploading; uploading starts when the fuses repository 10 activates its UEO-FR output which is connected to the UEI-6 input of the last DRM in the chain (in this case DR-Memory #6).

Since no faulty address was detected inside DRM #6 only the EM marker is output before it activates its UEO-6 output, enabling DRM #5 to drive the FDIO line. DRM #5 contains one NA5-bit faulty address vector which is output starting with the LSB bit right after a new EM marker and followed by a FA (Fuse Activation bit) marker. As no more faulty addresses are stored in DRM #5 the signal UEO-5 is activated enabling DRM #4 to upload its data. Memories #4 and #3 have no data to upload; the FDIO line is granted to DRM #2 after two more EM markers are output. DRM #2 outputs the EM marker followed by two NA2-bit faulty address vectors, each provided with a FA marker. Finally, three NA1-bit faulty address vectors with the respective FA markers are transferred from DRM #1, preceded by another EM marker.

At the end of the process the UEO-1 output connected to the UCI-FR input prevents the fuses repository 10 from uploading more bits and disables the internal counter which holds the total number of bits transferred (including markers) during the upload.

Signal FO (Fail Output) becomes active when UCI-FR goes active; should this not occur before the internal counter overflows will cause FO going active with the ZC (Zero Count) signal, indicating that the upload sequence didn't complete successfully. It is to be noted that an upload stream of 6 consecutive EM markers means that no faulty addresses were detected in the memories.

Figure 7:
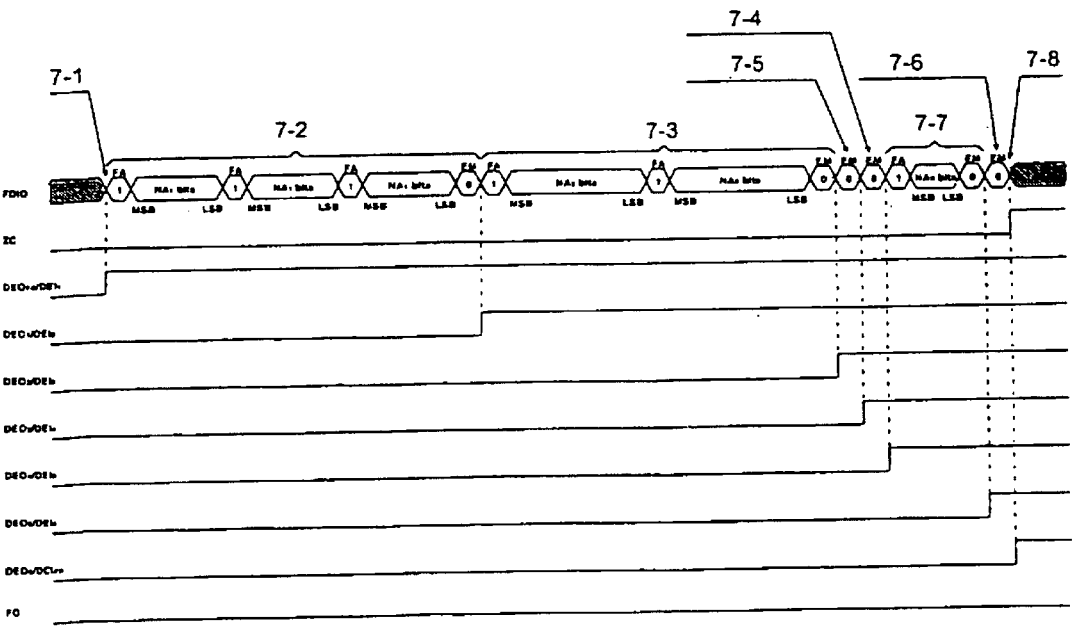
FIG. 7 is a timing diagram showing a successful writing operation of faulty address values to defect repairable memories of a circuit device shown in FIG. 1 (successful download from the central fuse box).

FIG. 7 shows a timing diagram of a faulty address values download completed successfully. In this Figure, the following abbreviations are used:

7-1: Start upload
7-2: DRM #1: 3 faulty address vectors
7-3: DRM #2: 2 faulty address vectors
7-4: DRM #4: No faulty address vector
7-5: DRM #3: No faulty address vector
7-6: DRM #6: No faulty address vector
7—7: DRM #5: 1 faulty address vector
7-8: End upload The counter inside the fuses repository 10 is set to the total bits to download (including markers); downloading starts when the fuses repository 10 activates its DEO-FR output which is connected to the DEI-1 input of the first DRM in the chain (DRM #1). As three consecutive FA bits in the stream are present, three NA1-bit faulty address vectors are downloaded to DRM #1 (MSB first), followed by an EM marker. Once detected, the EM marker causes DRM #1 to handover to DRM #2 by activating the DEO-1 signal which is connected to DEI-2.

The stream contains two more consecutive FA bits which cause DRM #2 to download two NA2-bit faulty address vectors.

The following EM marker causes DRM #2 to handover to DRM #3 by activating the DEO-2 signal which is connected to DEI-3.

Two consecutive EM markers indicate that Memories #3 and #4 receive no data; signals DEO-3 and DEO-4 are activated in sequence enabling DRM #5 to get the incoming data portion from the FDIO line. DRM #5 is downloaded with one NA5-bit faulty address vector, then it handovers to DRM #6 which has no data to download (no more FA markers in the stream). DRM #6 activates its DEO-6 line which is connected to the DCI-FR input of the fuses repository 10; signal FO (Fail Output) not going active when DCI-FR goes active indicates that the ZC (Zero Count) signal went high as expected.

Figure 8:
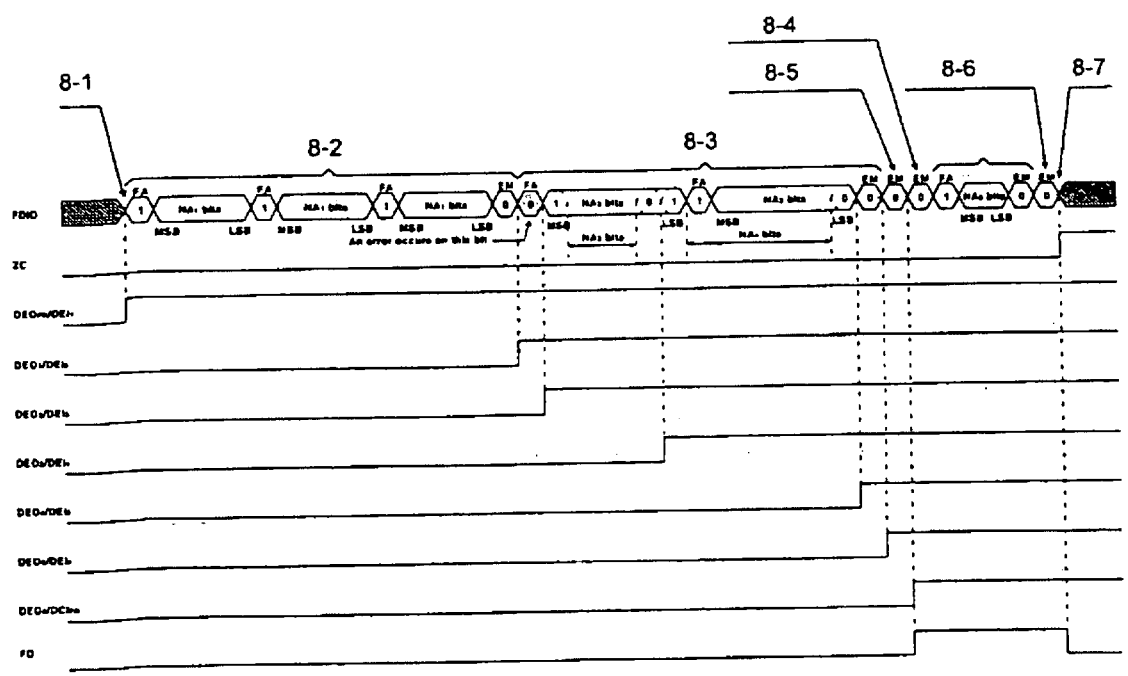
FIG. 8 is a timing diagram showing an unsuccessful writing operation of faulty address values to defect repairable memories of a circuit device shown in FIG. 1 (failed download from the central fuse box).

FIG. 8 shows a timing diagram of a faulty address values download terminated abnormally. In this Figure, the following abbreviations are used:

8-1: Start download
8-2: DRM #1: 3 faulty address vectors
8-3: DRM #2: 2 faulty address vectors
8-4: DRM #4: No faulty address vector
8-5: DRM #3: No faulty address vector
8-6: DRM #6: No faulty address vector
8-7: DRM #5: 1 faulty address vector
8—8: End download Due to an error in the downloaded bit stream, a FA marker is turned into a 0 causing DRM #2, which was expected to catch the incoming stream portion, to handover to DRM #3. If the MSB of the data following the wrong FA marker is a 1, DRM #3 assumes the next NA3 bits to be downloaded. The bit at 0 following the NA3 bits is interpreted as an EM marker, causing DRM #3 to handover to DRM #4. Then a bit at 1 is encountered which forces DRM #4 to download the next NA4 bits; as a bit at 0 follows, DRM #4 handovers to DRM #5.

The following two EM markers cause DRM #5 and DRM #6 to handover immediately, leading to premature download termination (ZC not yet active) and FO (Fail Output) goes active as a consequence. The mechanism described above shows how a failure in a marker bit is propagated to the incoming part of the download bit stream.

If no errors occurred, uploaded and downloaded bit-streams are identical. In case of mismatches the bitstreams can be acquired and analyzed off-chip through the FDIO line for more accurate failure detection.

The embodiment allows the implementation of multiple upload/download passes: Several tests are performed during the production steps, i.e., wafer level, burn-in, post packaging etc.; even at different environmental conditions. Depending on which phase and conditions the test is being executed, additional faults and defects may appear, the related data needing to be stored and reloaded into chip redundancies prior to performing the next test. Implementing on-chip storage and reload of fault data during multiple passes is greatly advantageous in terms of testing time reduction and for minimizing test software development efforts.

Figure 9:
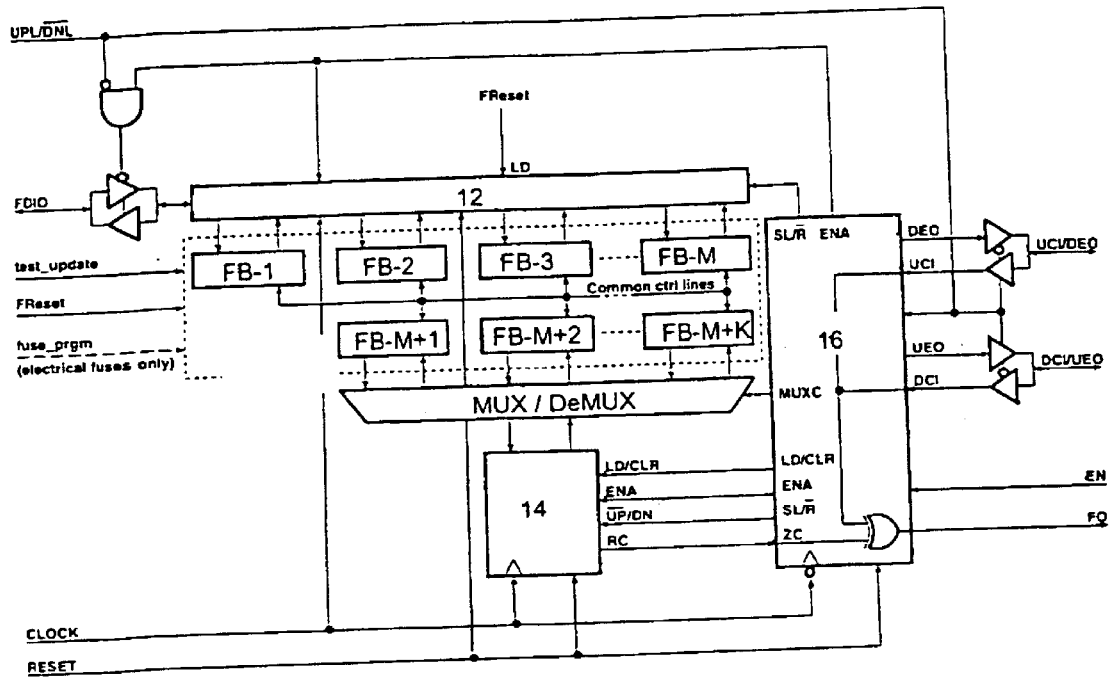
FIG. 9 is a schematic block diagram of another preferred fuse box of the circuit device shown in FIG. 1.
Figure 10:
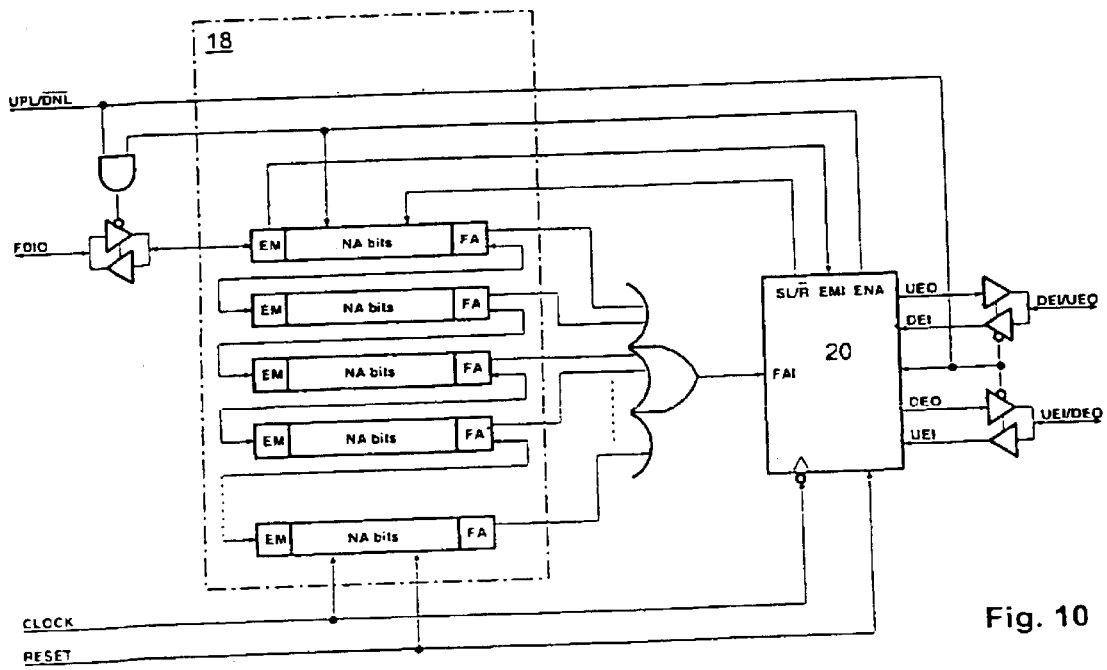
FIG. 10 is a schematic block diagram of a redundant address register array for each defect repairable memory of the circuit device of FIG. 1.

In the following, a more general method for uploading and downloading the content of the centralized fusebox repository 10 during different testing passes is described. The centralized fusebox repository 10 and the redundant register blocks require only slight changes with respect to the previously discussed architecture (FIGS. 2 and 3), as shown in FIG. 9 and FIG. 10.

Each faulty address vector is provided with an EM and an FA marker which flag the end of a block of vectors and the presence of at least a faulty address vector, respectively.

This leads to minor fuse count overhead for additional markers, but improves flexibility in data uploading/downloading. For each block of address vectors (i.e., vectors belonging to one memory) all EM and FA markers are set to 1, except the EM marker in the last downloaded vector which is set to 0.

During uploads, each memory outputs its faulty address data to the FDIO line as long as its UEI input is active, its registers contain at least a FA bit set to 1 and a new EM marker set to 0 is encountered in the registered data (End-of-block condition). When an end-of-block condition is reached, the memory activates its UEO output enabling the next memory in the chain to upload its block of faulty address vectors through the FDIO line. Uploading data to fusebox repository 10 terminates when the last memory in the chain activates its UEO line.

During downloads, each memory gets faulty address data from the FDIO line as long as its DEI input is active and an EM marker set to 0 is received (End-of-block condition). When an end-of-block condition is reached, the memory activates its DEO output enabling the next memory in the chain to download its block of faulty address vectors.

As in the previous architecture, the fuses repository does not perform any check on EM/FA markers during uploads and downloads: data are merely shifted in and out as long as input EN is active and inputs UCI and DCI are not active; this makes the fuses repository 10 virtually independent from the type and configuration of the memories connected in the daisy chain. Depending on the state of the UPL/DNL input, faulty data related to one testing pass are uploaded or downloaded each time the EN input becomes active.

The following is a sample multiple-pass testing sequence with on-chip storage of fault data:

Run test #1.
Set UPL/DNL to 1 and activate EN to upload the fault data from test #1.
Program/blow the fuses elements to permanently store the data from test #1.
Activate the RESET input.
Set UPL/DNL to 0 and activate EN to download the fault data from test #1.
Run test #2.
Set UPL/DNL to 1 and activate EN to upload the fault data from test #2.
Set UPL/DNL to 1 and activate EN again to reload the fault data from test #1.
Program/blow the fuses elements to permanently store the data from test #2.
Activate the RESET input.
Set UPL/DNL to 0 and activate EN to download the fault data from test #1.
Set UPL/DNL to 0 and activate EN again to download the fault data from test #2.
Run test #3.
Set UPL/DNL to 1 and activate EN to upload the fault data from test #3.
Set UPL/DNL to 1 and activate EN again to reload the fault data from test #2.
Set UPL/DNL to 1 and activate EN again to reload the fault data from test #1.
Program/blow the fuses elements to permanently store the data from test #3 and so forth until the last test is executed.

Checking that upload/download sequences terminate successfully and generating the FO signal requires additional logic in that a counter preset value is provided for each download pass; in addition, the counter value at the end of each upload is stored into a pass-specific group of fuses. To achieve this, an additional pass-counter is provided inside the control logic block to keep count of the number of times EN became active, thus switching the bit counter data from/to the appropriate group of fuses (i.e., fusebox M+1, M+2, . . . , M+K, see FIG. 9).

Figure 11:
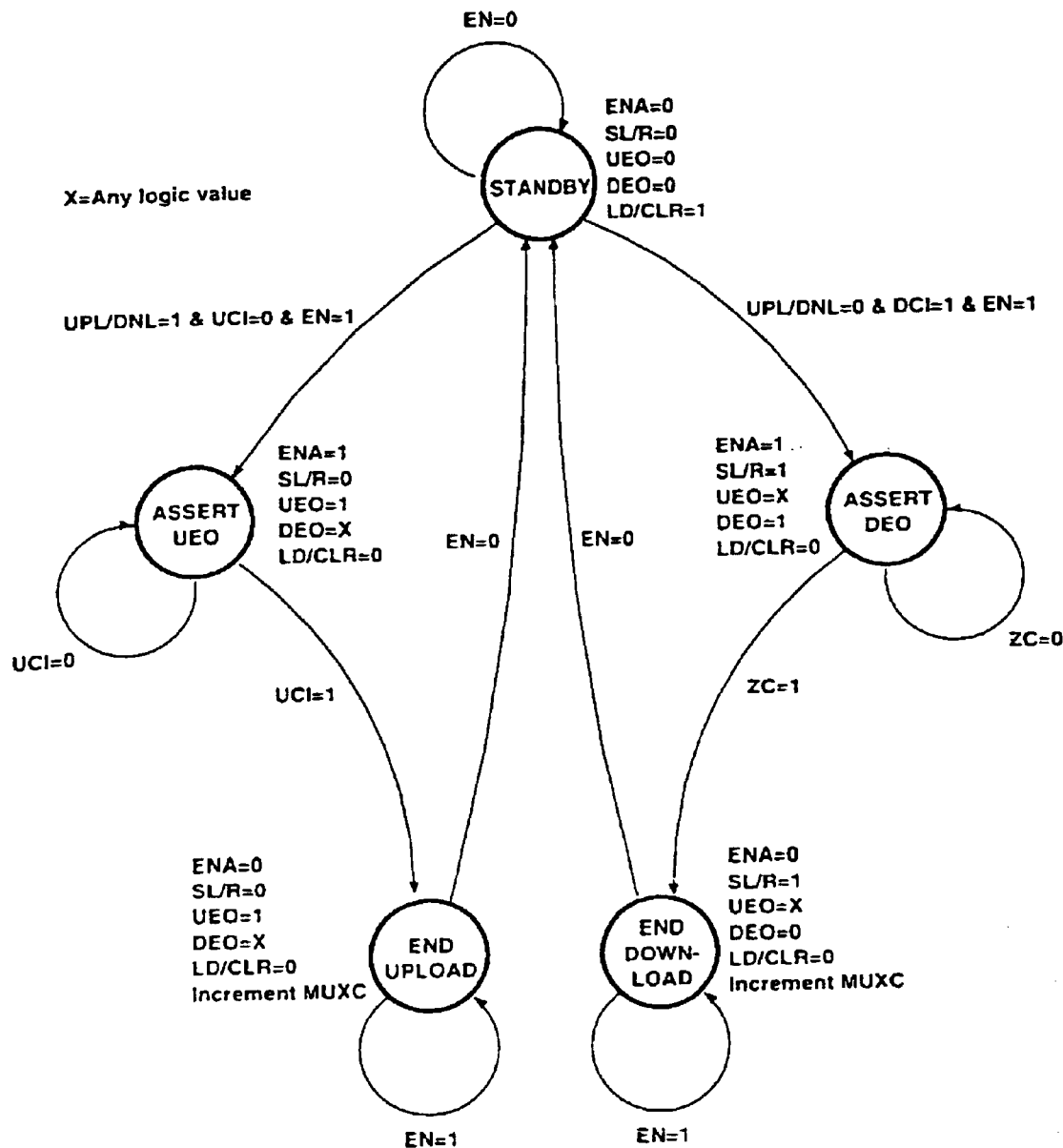
FIG. 11 is a multiple upload/download fuse box control logic state diagram of the fuse box shown in FIG. 9.
Figure 12:
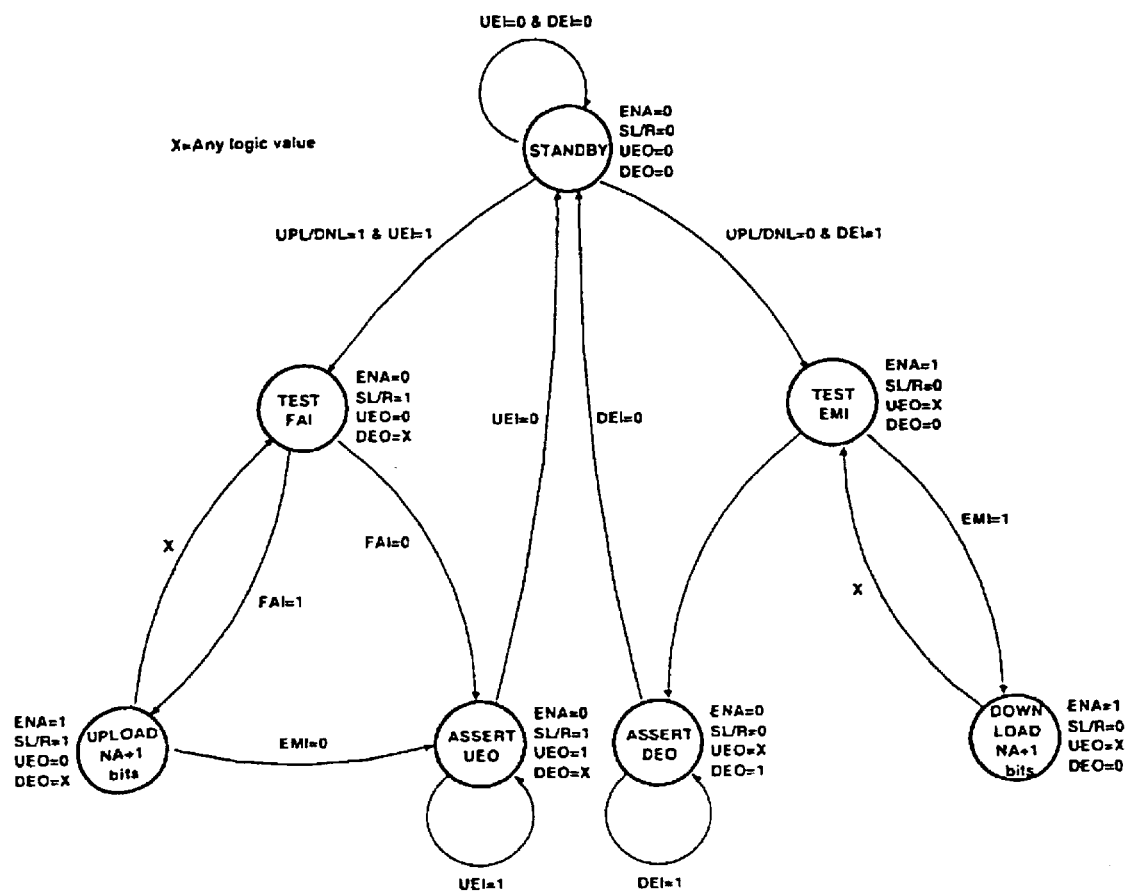
FIG. 12 is a redundant address register control logic state diagram shown in FIG. 10.

The control logic state diagrams for either the redundant address registers and the fuse repository are shown in FIG. 11 and FIG. 12.

Figures 13, 14:
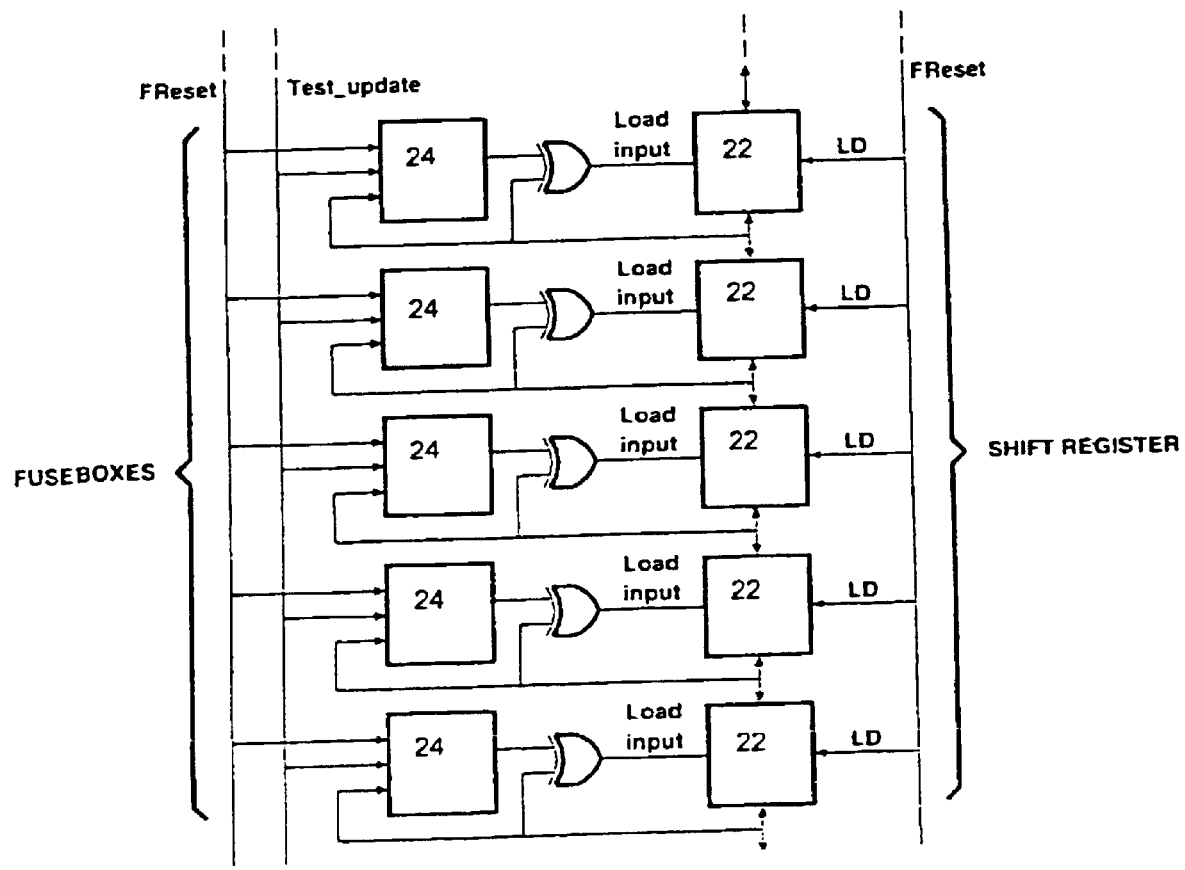
FIG. 13 is a table comparing fuse cell values with uploaded values.
FIG. 14 is a schematic block diagram showing the XORed loading of fuse data into the fuse box shift register.

After each testing pass, the fusebox repository 10 can provide to the test equipment an already formatted vector of fuse elements to blow (in case of laser fuses are used). FIG. 14 shows the internal structure of the shift register and the fuseboxes. The load input of each flip flop 24 in the shift register is connected to the corresponding fuse cell 22 by means of a XOR gate. Once a testing pass is executed, data are shifted into the fuses repository 10.

When the FReset input is activated, data in the shift register are compared with the current fuse values and the result is reloaded into the shift register. The shift register cells which differ from the current fuse values will be set to 1, all the others being set to 0; the content of the shift register can be then streamed out to the test equipment through the FDIO line to program the laser cutter.

Since the value output from unblown fuse cells is 0, bits 1 in the streamed out data correspond to fuse elements to blow, while bits 0 indicate that the corresponding fuses are left unaltered (fuses can be either unblown or already blown, see FIG. 13).

An additional mechanism is provided to verify that memories are correctly downloaded with the fuse values, as described in the following steps:

Once the fuses are programmed, activate the RESET input (all bits in the shift register are set to 0).

Download the content of the shift register into memories (all passes).

Upload the faulty data values from the memories (all passes).

Activate the FReset input.

Stream out the content of the shift register and verify that all bits are set to 0. Notice that if all data bits are set to 0 during stream out, the content of the memory registers is not affected.

A comparison of the cell values with the uploaded values is exemplified by the table shown in FIG. 13.

In the following, a quick summary of the signal descriptions of the signals used in the above embodiments is given:

RESET: Reset Input. When active, this signal forces the control logic inside the defect repair memories DRM and the central fuses repository 10 into an initial (stand-by) state. Faulty address data, if present, are dropped from all the defect repair memories.

CLOCK: Clock Input. All block interfaces in the centralized fusebox architecture are synchronous with this signal.

UPL/DNL: Upload/Download. Data direction control input. When high, faulty address data are transferred from the defect repair memories to the central fuses repository 10 upload); when low, faulty address data are transferred from the central fuses repository 10 to the defect repair memories (download).

EN: Upload/Download Enable Input. When high, this signal enables data transfers between defect repair memories DRM and the central fuses repository 10. Input EN is deactivated prior to start a new upload or download.

FO: Fail Output. This signal is used to indicate that the last upload/download terminated abnormally. An error during the upload phase causes FO to become active (high) when the fuses repository internal counter overflows; an error during the download phase forces FO to go high for at least one clock cycle before the download ends.

FDIO: Faulty-address Data Input/Output. Bi-directional serial data line. Faulty address data from/to the defect repairable memories DRMs connected to a central fuses repository 10 are transferred through this line.

DEI: Download Enable Input. When high, this signal enables the defect repair memory to download the data from the FDIO input until the next End-of-stream Marker (EM) is encountered. Input DEI is ignored during uploads (i.e., UPL/DNL set to high).

DEO: Download Enable Output. When high, this signal indicates that the defect repairable memory has finished downloading its portion of data from the FDIO input. The fuses repository 10 activates its DEO output during the download process and keeps it active until a new upload or download is started. Output DEO is disabled during uploads.

UEI: Upload Enable Input. When high, this signal enables the defect repairable memory to drive the FDIO output until its faulty address data are uploaded. Input UEI is ignored during downloads (i.e., UPL/DNL set to low).

UEO: Upload Enable Output. When high, this signal indicates that the defect repairable memory has finished uploading its faulty address data. The fuses repository 10 activates its UEO output during the download process and keeps it active until a new upload or download is started. Output UEO is disabled during downloads.

DCI: Download Completed Input. During download this signal indicates that the defect repairable memory #N has finished downloading its portion of data. Signal DCI is used inside the fuses repository 10 to verify that the download process completed normally. Input DCI is ignored during uploads.

UCI: Upload Completed Input. During upload this signal indicates that the defect repairable memory #1 has finished loading its faulty address data. Signal UCI is used inside the fuses repository to verify that the upload process completed normally. Input UCI is disabled during downloads.

test_update: Test/Update Input. When high, this signal allows the data uploaded from memories to be temporarily stored in the fuse latches; latched data can be then down-loaded back to the memories for a pre-fuse test.

FReset: Load Fuse Values Input. When high, this signal enables the values permanently held by fuses to be loaded into the fuses repository internal shift register/counter (FIG. 2). FReset is activated prior to download fuse values into memories.

fuse_prgm: Electrical Fuse Program Input. When active, this signal causes the data uploaded from memories to be permanently stored into electrically programmable fuses.

The advantage of the above described preferred embodiment comprise:

Minor area overhead with respect to parallel fuse wiring for implementing redundant resources Grouping fuse boxes in one place facilitates the positioning of laser cutter, thus reducing testing time Improved optimization of fuse clustering reduces fusebox count Time overhead required for loading fuses negligible for many applications (e.g., loading 1000 fuses takes just 1 ms @1 MHz)

Allows changes in the number of redundant registers (e.g., basing on yield results) with low re-design effort Easy to simulate Softmacro/Hardmacro design feasible for fuses repository 10

Reduction of wiring needed to connect fusebox 10 to redundant memories DRM

Reduction of external test pins

Automatic detection of failures during data transfers between the fuse repository and the DRMs With reference to FIGS. 15 and 16, a second preferred embodiment and modifications thereof will now be described. Features of this embodiment which are identical or similar to the embodiment described with reference to FIGS. 1 to 14 will be denoted with the same reference numerals and no further description will be directed thereto.

Figure 15:
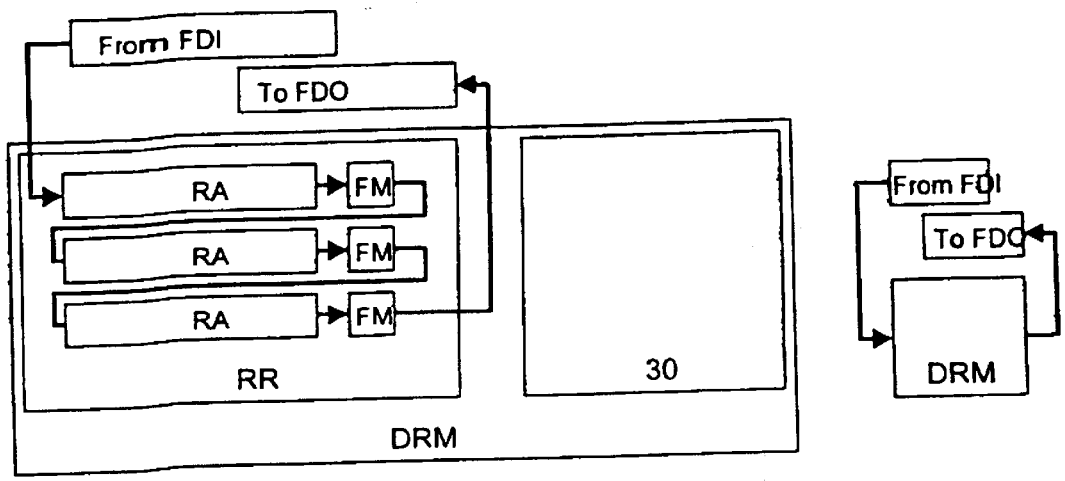
FIG. 15 is a schematic block diagram of a circuit device according to a second embodiment of the invention.

In FIG. 15, a defect repairable memory DRM (integrated circuit module) connected to a central fuse box is depicted. The data line going from the DRM to the central fuse box is labeled "to FDI" (fuse data input) and the line going from the central fuse box to the DRM is labeled "to FDO" (fuse data output). The DRM has redundancy registers labeled RR comprising a chain of register addresses RA and failure markers FM. Furthermore, the DRM is provided with a memory 30 having a plurality of memory cells/elements and at least one redundant memory element.

Figure 16:
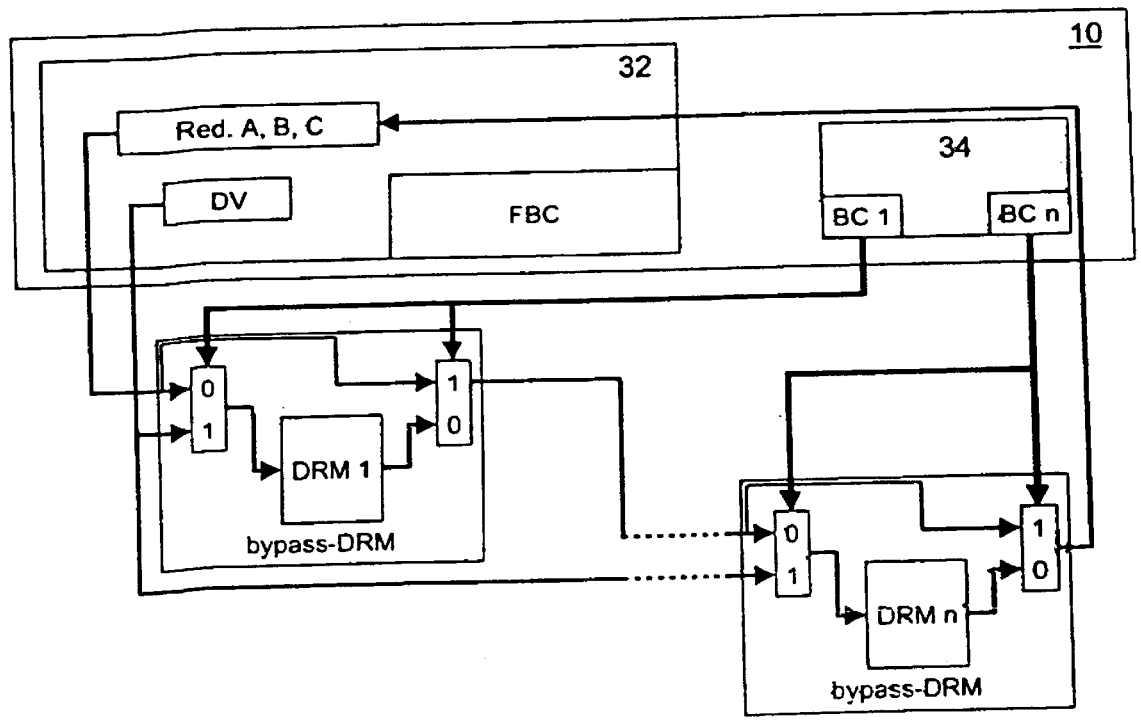
FIG. 16 is a schematic block diagram of the circuit device shown in FIG. 15 depicting in more detail the central fuse box.
Figure 17:
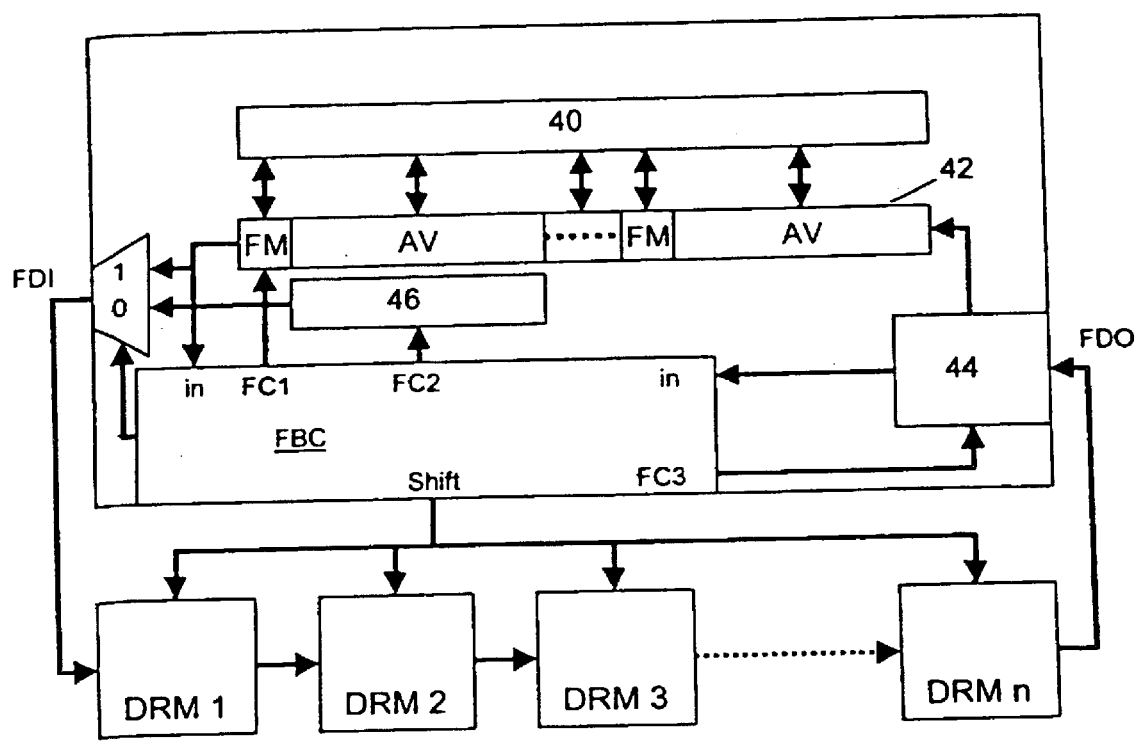
FIG. 17 is a schematic block diagram of a circuit device according to a third embodiment of the invention.
Figure 18:
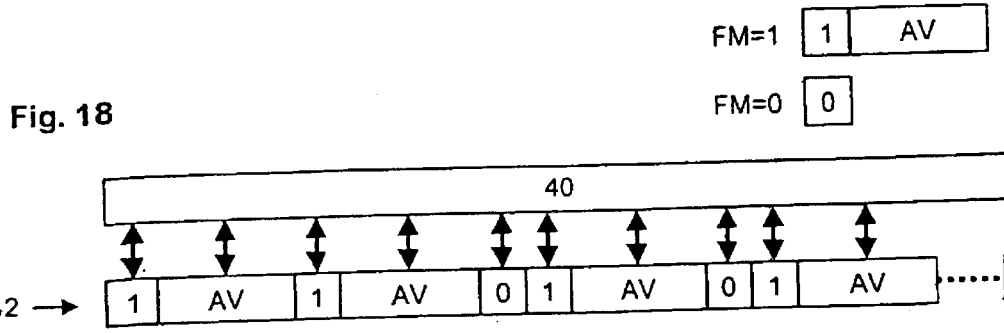
FIG. 18 is a schematic block diagram of a fuse register prepared for a writing operation of the circuit device shown in FIG. 17.

As shown in FIG. 16, in this embodiment, a configurable serial programming chain is able to activate all adjustable module elements, i.e., redundancies. The redundancy modules in this embodiment can be programmed with a serial scan chain. For this end, the central fuse box/fuse repository 10 contains two levels 32, 34 of fuse boxes or fuse elements:

Fuse elements/boxes of the first level 32 store data for all possible fuse information. All fuse data can be read out and in with the serial scan chain. Fuse elements of the second level 34 are adapted to program or configure the serial programming chain in order to activate or deactivate possible fuse elements inside the design. In order to configure the serial scan chain, at least one of the DRMs is provided with at least one multiplexer (denoted as (0; 1)-columns in FIG. 16). This multiplexer can be controlled by programming associated fuse elements of the second level fuse elements 34.

In FIG. 16, the two DRMs (DRM 1 and DRM n) shown are designed as bypass-DRMs. Both at the input and at the output stage of these DRMs, each bypass-DRM has a multiplexer (0; 1). If these multiplexers are set in their active state, the bypass-DRM is bypassed by the serial scan chain. The multiplexers can be controlled by the bypass control output lines (BC1 . . . BD n) of the second level fuses 34. Thus, the multiplexers at the input and output of the redundancy modules activate or deactivate the redundancy elements. The control fuses (second level fuses) are able to switch on and off part of the redundancy logic with these multiplexers so that the serial scan chain can be configured. Different redundancy configuration mechanism can be implemented for activating word, word-line, bit-line redundancies for memories.

The data transfer between the central fuse box 10 and the (bypass-) DRMs is controlled by a fuse box controller FBC. If an input multiplexer (0; 1) of the bypass-DRMs is set in its active state, the FBC outputs dummy values DV to this DRM. The serial shift operation can be also be controlled by the TAP controller. A similar configuration/operation is able to handle a device identification (id) register.

Preferably, the DRMs can be divided into sub-blocks up to one control signal per RR. Preferably, in order to allow a second fuse burn operation, fuse elements not blown (programmed) after a first session can be configured in a way that they can be activated later. For example, each memory array will have one more fuse element that is not blown after the first fuse pass. If another defect is identified during a second test these free fuse elements can be blown after the second test. Further preferably, the fuse control can be divided into a global multiplexer signal that activates for all memories 50% (or another value) of the fuses.

A third embodiment of the invention and modifications thereof will now be described with reference to FIGS. 17 to 23. As before, features of this embodiment identical to previous embodiments are denoted by the same reference numerals and no further description will be directed thereto.

The central fuse box/fuse repository 10 of this embodiment contains a plurality of fuse elements 40. These fuse elements 40 are connected in parallel to a fuse box register 42, which constitutes a shadow register of the values stored in the fuse elements 40. In an initializing procedure, the values stored by the fuse elements 40 are loaded into the fuse box register 42. The output of the fuse box register 42 is serially connected to an input "in" of the fuse box controller FBC. The input of the fuse box register 42 is preferably connected to an output of a reduction filter 44 provided in the central fuse box 10. The reduction filter 44 is controlled by the fuse box controller FBC. The central fuse box 10 further comprises a dummy address register 46 controlled by the fuse box controller FBC.

In the following, the operation of the third embodiment will be described.

During the serial shift operation, the controller FBC identifies with the first control bit FM if a fuse/fuse element should be blown or not. If the redundancy (i.e., the adjustable module element) should be blown by a certain value, this first bit FM is followed by the "blown value", which is the value of the false word, word-line or bit-line. In other cases the local redundancy is not used, which implies that for the controller FBC that the serial shift vector is filled with dummy values (e.g., all zeros). This procedure will be repeated for all redundancy cells on chip. It allows to initialize all redundancies registers RR in the local memory arrays. The number of clock cycles are known. In addition, the fuse controller FBC knows the length of the blown addresses and the number of RRs. Hence, all DRMs are connected with the central fusebox 10 via a serial chain. The control signals FM (failure marker) identifies if the fuse is blown or not. Multiple dummy values DV for addresses that are not activated are possible with this approach.

To write data to the redundancy registers RR of the DRMs, a serial shift operation is necessary and will be described now:

Firstly, a write procedure will be described to initialize all redundancy registers RR with a definite length. At the beginning, an initialization procedure is performed for all redundancy registers RR. This will be described with reference to FIG. 18. In the upper right corner of FIG. 18, the blown fuse elements 40 for an activated (FM=1) and a deactivated register 42 (FM=0) are shown. Below, a possible configuration for the fuse elements 40 with its corresponding register 42 for shifting out the data is depicted. The address value length AVL is assumed to be known. For each fusible register or register string, a control signal FM is placed in the fuse box 10. This allows to place a definite value in the registers 42 of the DRMs. If FM=0, the value of the register element will be zero. In this case, no data for the addresses will be stored in the fuse box 10. The values of the register elements will be set to zero as a default. Hence, the dummy value for the redundancy register RR is written to FDI (fuse data input). This implies that the serial data stream will be expanded with the appropriate data (e.g., all zeros).

The number of fuse elements needed for this embodiment is as follows: Assuming to have N repair registers and M faulty defects, the central fusebox 10 consumes following fuse bits which will be the minimal fuse length (FL) while AVL is the address value length of the address AV that will be stored in the repair registers.

$$FL=N+M*AVL$$

Figure 19:
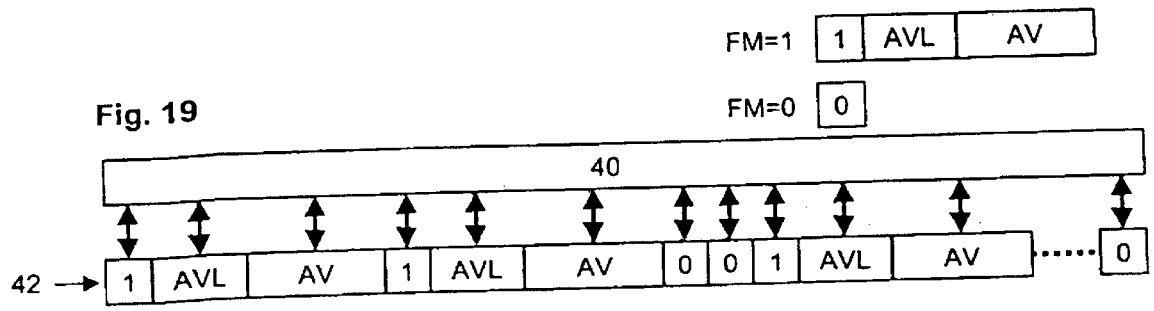
FIG. 19 is a schematic block diagram of another fuse register scheme of the circuit device shown in FIG. 17.

With reference to FIG. 19, a write procedure to initialize the redundancy registers RR with a variable length will be described. If the length AVL of the address value AV is varying, the data AVL is also stored. This can be achieved by the fuse register after the FM signal. This allows to change between different address lengths in the chip. All AVL have always the same length. A length of AVL (AVLL) with 3 bit can distinguish between 8 different register lengths for a chip.

The number of fuse elements needed for this embodiment is as follows: Assuming to have N repair registers and M faulty defects, the central fusebox 10 consumes following fuse bits which will be the minimal fuse length (FL) while AVL is the address value length of the address AV that will be stored in the repair registers. AVLL is here the length of the AVL.

$$FL=N+M*(AVLL+AVL)$$

Figure 20:
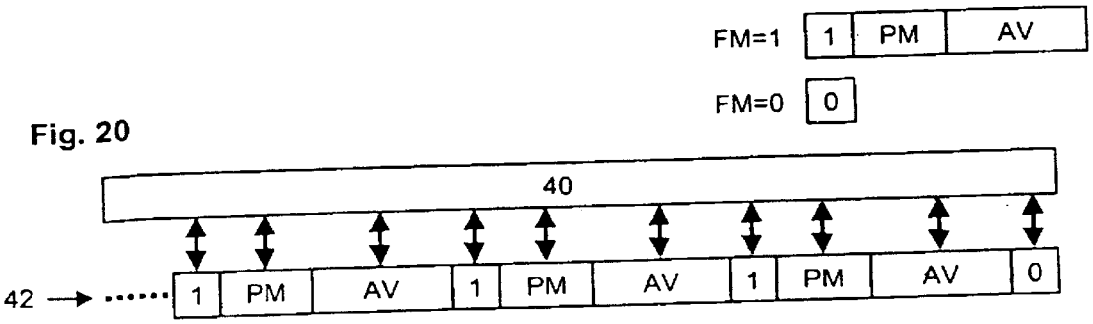
FIG. 20 is a schematic block diagram of another fuse register scheme of the circuit device shown in FIG. 17.

With reference to FIG. 20, a write procedure to overwrite individual redundancy registers RR in the fuse path with fixed length will be described now. To be able to write additional fuse information to dedicated repair registers after the first fuse session, the following procedures can be adopted. Here, not all register content will be overwritten. Only the registers that are necessary for additionally found defects will be activated.

In FIG. 20, a session is described where additional addresses of defects are stored with a place marker (PM) while the address value length is known for all repair registers. The place marker is used to specify the place in the scan chain. This can be done by using the number of cycles that are necessary to reach the starting point to overwrite the values.

The number of fuse elements needed for this embodiment is as follows: Assuming to have N repair registers and K faulty defects the central fusebox consumes following fuse bits which will be the minimal fuse length (FL) while PML is length of PM.

$$FL=K*(1+PML+AVL)+1$$

Figure 21:
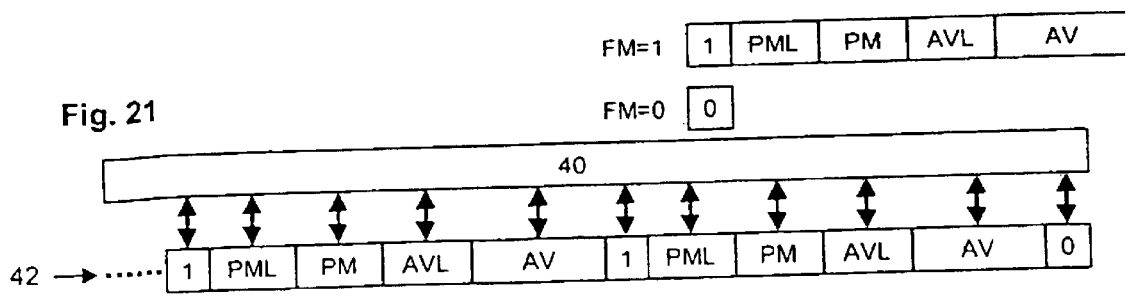
FIG. 21 is a schematic block diagram of another fuse register scheme of the circuit device shown in FIG. 17.

With reference to FIG. 21, a write procedure to overwrite individual redundancy registers RR in the fuse path with a variable length will be described now. FIGS. 20 and 21 depict how results can be patched from previous brun sessions that have been stored in the fuse box 10.

If the length of the address value is not known it is added to the fuse string, like it is shown in FIG. 21. Then, the length of PM (PML) and AVL is stored in the fuse string to identify each individual register. Because of the number of additional fuse information this procedure is only possible for a limited number of defect RRs.

The number of fuse elements needed for this embodiment is as follows: Assuming to have N repair registers and K faulty defects the central fusebox consumes following fuse bits which will be the minimal fuse length (FL) while PML is length of PM.

$$FL=K*(1+PML+AVLL+AVL)+1$$

Figure 22:
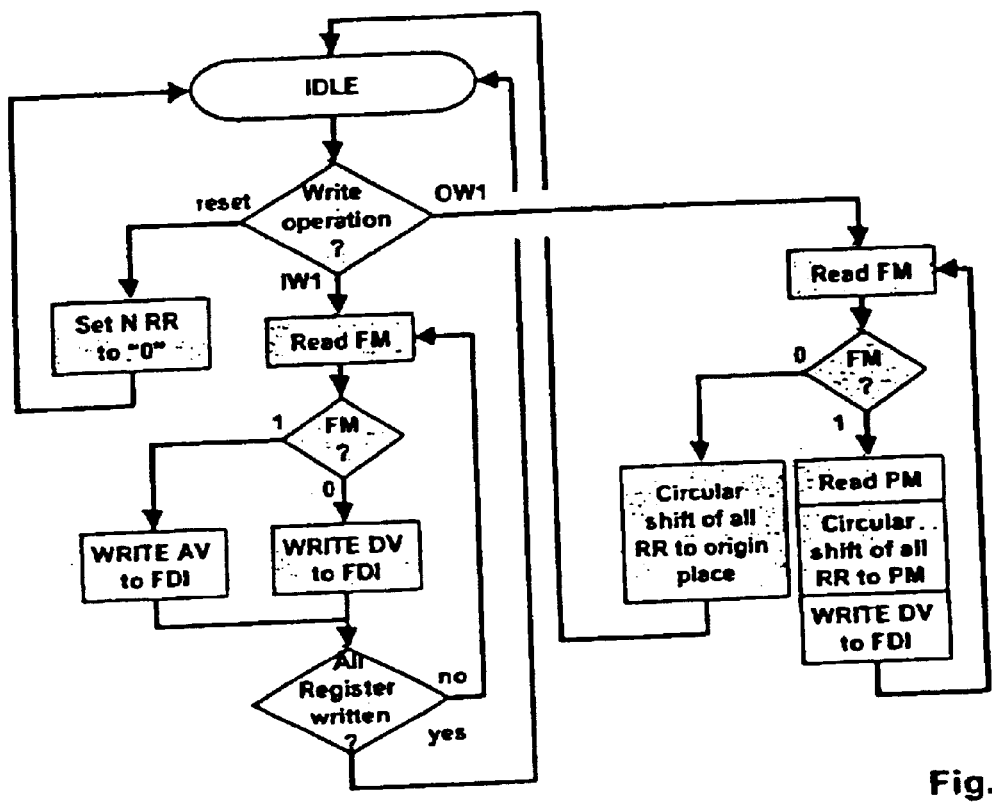
FIG. 22 is a flow diagram of the write operation of a fuse box controller of the circuit device shown in FIG. 17 with known AVL.

In FIG. 22, the control flow of the fuse controller FBC when the AVL of the repair registers are known is shown. IW1 denotes the initial write operation with a fixed RR length. OW1 denotes the overwrite operation after the first fuse session is already performed. For completeness, a reset state is presented. As noted before, the IW procedure will also initialize the full register chain of all DRMs.

Figure 23:
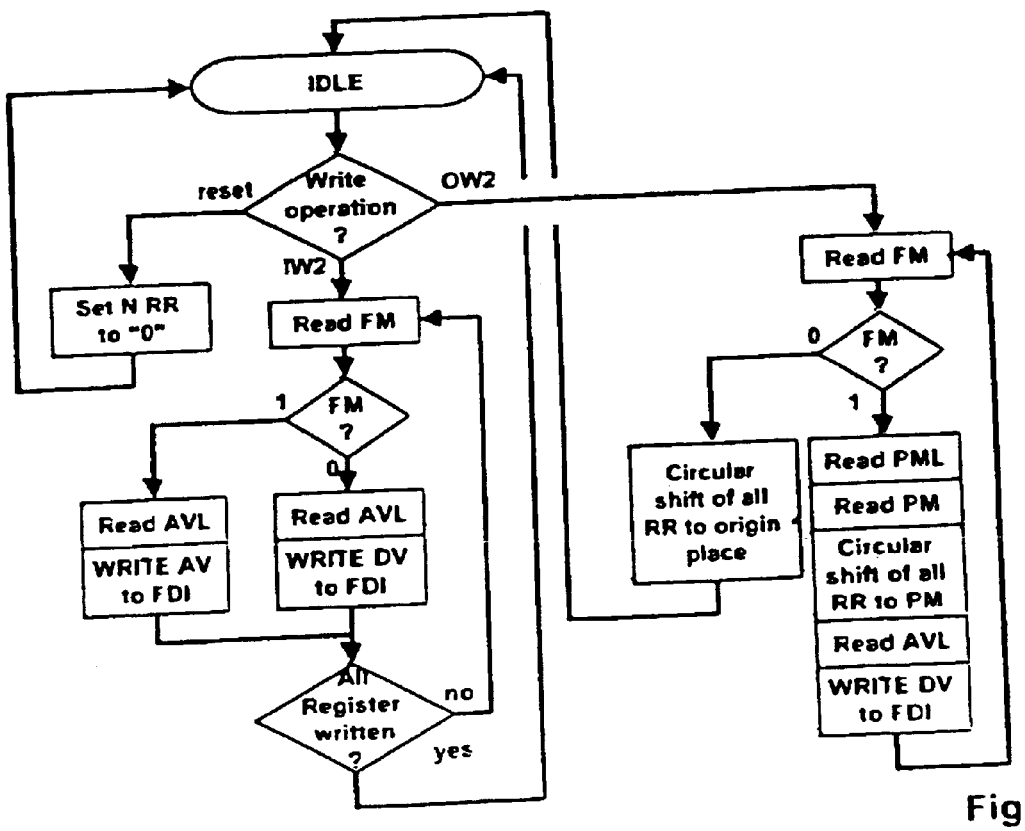
FIG. 23 is a flow diagram of the write operation of a fuse box controller with an unknown AVL.

In FIG. 23, the control flow is described when the address length of the repair registers are not known. The flow is similar to the already described cases above.

Moreover, also read processes for storing data in the fuse string can be implemented. The above described processes show that it is possible to store all relevant data in one central fuse register for a chip. After a memory test, some (further) defects can be found. Furthermore, using a golden device, it can be checked whether or not the fuses elements have been blown properly. They will/can be directly stored in the RR to active the redundancy. To analyze the RR and feedback the data to the fusebox 10, a similar procedure read procedure is possible. Here, the data can be uploaded from the DRMs to the central fuse box 10. The reduction filter 44 reduces the bit stream by deleting data values following a failure marker bit FM set to 0. Thus, the reduction filter 44 performs a data compression in order to generate a formatted bit stream of fuse values ready for programming. This modification of the third embodiment will be particularly useful in conjunction with electrical fuses. Then, the controller FBC can store additional fuse information to already stored fuse data. To store the data of non-volatile memories (e.g., Flash memories) a read operation is even more interesting because failures can be added and modified during the life cycle of the chip. The fuse box controller is able to compare the results from previous fuse sessions. When the fuse box controller detects corresponding changes, it can program or blow fuse elements in the central fuse box as long as spare fuse elements are available.

Thus, there is provided a fuse box that serves several other fault repairable memories DRMs through serial shift operations. Individual programming of each address register or decoder register provided inside each redundancy memory is possible. Further, a formatted bit stream is directly available after upload. No off-chip processing is required for faulty addresses alignment into the fuseboxes. The defects in the burn procedure can also be overwritten by a later fuse activation session. All redundancy register information can be shifted back to the fusebox and fuses can be activated. Beside the FM signal for each register, a second control signal can be used to identify a complete DRM a fault free. Further, the control signal can be such that with one signal parts of all DRMs can activated or deactivated.

What is claimed is:

1. A semiconductor memory device comprising:
   a plurality of integrated circuit modules each having a plurality of module elements and at least one adjustable module element,
   at least one fuse box electrically connected to the plurality of integrated circuit modules, the fuse box having a plurality of programmable fuse elements, that, when programmed, adjust the adjustable module element;
   wherein the fuse box comprises a fuse box controller that is adapted to detect errors in data communicated between the fuse box and the integrated circuit modules.

2. The device of claim 1, wherein the plurality of programmable fuse elements consists of a number of programmable fuse elements that is insufficient to adjust all of the adjustable module elements of all of the integrated circuit modules.

3. The device of claim 1, wherein the integrated circuit modules comprise defect repairable circuit modules and the adjustable module element comprises a redundant module element adapted to replace a defective module element.

4. The device of claim 3, wherein the defect repairable circuit modules comprise defect repairable memories and the redundant module element comprises a redundant memory element.

5. The device of claim 1, wherein the fuse elements comprise volatile memories.

6. The device of claim 1, wherein the fuse elements comprise non-volatile memories.

7. The device of claim 1, wherein the fuse elements comprise laser programmable fuse elements.

8. The device of claim 1, wherein the fuse elements comprise electrically programmable fuse elements.

9. The device of claim 1, further comprising a separate fuse chip, and wherein the fuse box is disposed on the separate fuse chip.

10. The device of claim 1, further comprising a separate fuse board, and wherein the fuse box is disposed on the separate fuse board.

11. The device of claim 1, wherein the fuse box comprises at least one fuse box register connected to the fuse elements for storing fuse data.

12. The device of claim 1, wherein the fuse box comprises a bi-directional input/output pin for enabling communication of fuse data between the fuse box and an external testing tool.

13. The device of claim 1, wherein the fuse box and the integrated circuit modules are serially connected in a daisy chain arrangement.

14. The device of claim 13, wherein the fuse box comprises a fuse box controller enabling serial shift operations of data through the daisy chain arrangement.

15. The device of claim 13, wherein the fuse box comprises a fuse data input connected to a first end of the chain of serially connected integrated circuit modules and a fuse data output connected to a second end of the chain of serially connected integrated circuit modules, the second end being opposite the first end.

16. The device of claim 15, wherein the fuse box comprises a fuse box controller for enabling uploading of data from the integrated circuit modules to the fuse box.

17. The device of claim 16, wherein the fuse box controller is adapted to program at least one of the fuse elements based on an analysis of the uploaded data in order to adjust at least one of the integrated circuit modules.

18. The device of claim 13, further comprising
a bi-directional data line connecting the fuse box and the integrated circuit modules, and
at least two control lines connecting the fuse box and the integrated circuit modules.

19. The device of claim 13, wherein the fuse box comprises:
a plurality of control fuse elements, the control fuse elements being adapted to control at least one multiplexer of at least one of the integrated circuit modules in order to configure the daisy chain arrangement.

20. The device of claim 19, wherein at least one of the integrated circuit modules comprises two multiplexers connected by a bypass line and, in a bypass state of the multiplexers, the bypass line forms part of the daisy chain so that at least a part of the integrated circuit module is bypassed by the daisy chain.

21. The device of claim 13, further comprising:
a fuse box controller adapted to form a formatted bit stream of fuse data to be communicated between the fuse elements and the fuse box,
the bit stream including, for each integrated circuit module, at least one adjustment control bit for each register address of the integrated circuit module and, if the adjustment control bit is set, a plurality of data bits.

22. The device of claim 21, wherein the fuse box controller is configured to include, in the formatted bit stream of fuse data, address value data bits representative of a defect circuit element to be replaced by a redundant circuit element associated with the adjustment control bit.

23. The device of claim 21, wherein the fuse box controller is configured to include, in the formatted bit stream of fuse data, at least one length control bit indicating the number of following data bits in the formatted bit stream.

* * * * *